United States Patent
Zhang et al.

(10) Patent No.: US 10,892,028 B2
(45) Date of Patent: Jan. 12, 2021

(54) SHIFT REGISTER AND METHOD OF DRIVING THE SAME, GATE DRIVING CIRCUIT AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Yuanbo Zhang, Beijing (CN); Xiaolin Wang, Beijing (CN); Zhuo Xu, Beijing (CN); Shuai Chen, Beijing (CN); Zhulin Liu, Beijing (CN)

(73) Assignees: BOE TECHNOLOGY GROUP CO., LTD., Beijing (CN); Chongqing BOE Optoelectronics Technology Co., Ltd., Chongqing (CN)

( * ) Notice: Subject to any disclaimer, the term of this patent is extended or adjusted under 35 U.S.C. 154(b) by 180 days.

(21) Appl. No.: 16/105,274

(22) Filed: Aug. 20, 2018

(65) Prior Publication Data

US 2019/0206503 A1 Jul. 4, 2019

(30) Foreign Application Priority Data

Jan. 3, 2018 (CN) .......................... 2018 1 0006247

(51) Int. Cl.
*G11C 19/00* (2006.01)
*G11C 19/28* (2006.01)
(Continued)

(52) U.S. Cl.
CPC ............. *G11C 19/287* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS

| 2011/0286572 A1* | 11/2011 | Shang ..................... G11C 19/28 |
| | | 377/67 |
| 2012/0113088 A1* | 5/2012 | Han ...................... G09G 3/3674 |
| | | 345/212 |

(Continued)

FOREIGN PATENT DOCUMENTS

| CN | 106228927 A | 12/2016 |
| CN | 107301833 A | 10/2017 |
| CN | 107464521 A | 12/2017 |

OTHER PUBLICATIONS

First Office Action issued in Chinese Application No. 201810006247.2, dated Jan. 3, 2020, with English translation.

*Primary Examiner* — Tuan T Lam
(74) *Attorney, Agent, or Firm* — Michael E. Fogarty

(57) ABSTRACT

A shift register includes a pull-up control circuit, a pull-up circuit, a pull-down control circuit, a pull-down circuit, and a reset circuit. The pull-down circuit is connected to the pull-down node, the pull-up node, a second control terminal, a first voltage terminal, and a signal output terminal, and is configured to pull down potentials of the pull-up node and the signal output terminal to a potential of the first voltage terminal under the control of the pull-down node; moreover, the pull-down circuit is further configured to pull down potentials of the pull-up node and the signal output terminal to a potential of the first voltage terminal under the control of a signal from the second control terminal.

11 Claims, 10 Drawing Sheets

(51) Int. Cl.
*G09G 3/20* (2006.01)
*G09G 3/36* (2006.01)
(52) U.S. Cl.
CPC ........... *G09G 2310/0267* (2013.01); *G09G 2310/0286* (2013.01); *G09G 2310/08* (2013.01)

(56) References Cited

U.S. PATENT DOCUMENTS

| | | |
|---|---|---|
| 2012/0293401 A1 | 11/2012 | Li et al. |
| 2016/0155409 A1* | 6/2016 | Jeoung ................... G09G 5/003 345/214 |
| 2017/0278473 A1* | 9/2017 | Shang ..................... G09G 3/36 |
| 2017/0316751 A1* | 11/2017 | Wang .................. G09G 3/3685 |
| 2017/0365204 A1* | 12/2017 | Choi ................... G09G 3/2092 |
| 2018/0190227 A1* | 7/2018 | Feng ................... G09G 3/3674 |
| 2018/0190364 A1* | 7/2018 | Gu ....................... G11C 19/184 |
| 2018/0286302 A1* | 10/2018 | Feng ................... G11C 19/184 |
| 2019/0066562 A1* | 2/2019 | Hu ........................... G09G 3/20 |

* cited by examiner

SHIFT REGISTER AND METHOD OF DRIVING THE SAME, GATE DRIVING CIRCUIT AND DISPLAY DEVICE

CROSS-REFERENCE TO RELATED APPLICATION

This application claims priority to Chinese Patent Application No. 201810006247.2, filed on Jan. 3, 2018, titled "SHIFT REGISTER UNIT AND METHOD OF DRIVING THE SAME, GATE DRIVING CIRCUIT, AND DISPLAY DEVICE", which is incorporated herein by reference in its entirety.

TECHNICAL FIELD

The present disclosure relates to the field of display technologies, and in particular, to a shift register and a method of driving the same, a gate driving circuit, and a display device.

BACKGROUND

In display technologies, in order to achieve low cost and narrow bezel, a Gate driver On Array (GOA) technology is generally adopted. That is, a gate driving circuit is integrated inside a panel through the thin film transistor process, thereby achieving the advantages of narrow bezel and low integrated circuit (IC) and assembly costs.

When designing the GOA circuit, it is necessary to pay close attention to the time during which a bias voltage is applied to the gate electrode of each thin film transistor in the GOA circuit, so as to prevent the threshold voltage shift (Vth shift) from being too large to cause the circuit to fail and reduce the service life of the GOA circuit. From the application aspect of displays, GOA circuits with long service life, low power consumption and high stability are the development trends of display products at the moment.

SUMMARY

Some embodiments of the present disclosure provide a shift register comprising a pull-up control circuit, a pull-up circuit, a pull-down control circuit, a pull-down circuit, and a reset circuit. The pull-up control circuit is connected to a signal input terminal and a pull-up node, and is configured to pull up a potential of the pull-up node to a potential of a signal from the signal input terminal under the control of the signal from the signal input terminal. The pull-up circuit is connected to the pull-up node, a clock signal terminal and a signal output terminal, and is configured to output a signal from the clock signal terminal to the signal output terminal under the control of the pull-up node. The pull-down control circuit is connected to a first control terminal, a pull-down node, a first voltage terminal, and the pull-up node, and is configured to pull down a potential of the pull-down node to a potential of the first voltage terminal under the control of the pull-up node; and the pull-down control circuit is further configured to output a signal from the first control terminal to the pull-down node under the control of the signal from the first control terminal. The pull-down circuit is connected to the pull-down node, the pull-up node, a second control terminal, the first voltage terminal, and the signal output terminal, and is configured to pull down potentials of the pull-up node and the signal output terminal to a potential of the first voltage terminal under the control of the pull-down node; moreover, the pull-down circuit is further configured to pull down potentials of the pull-up node and the signal output terminal to a potential of the first voltage terminal under the control of a signal from the second control terminal. The reset circuit is connected to a reset signal terminal, the first voltage terminal, and the pull-up node, and is configured to pull down a potential of the pull-up node to a potential of the first voltage terminal under the control of a signal from the reset signal terminal.

In some embodiments, the pull-down circuit comprises a first pull-down sub-circuit and at least one second pull-down sub-circuit. The first pull-down sub-circuit is connected to the pull-down node, the pull-up node, the first voltage terminal, and the signal output terminal, and is configured to pull down potentials of the pull-up node and the signal output terminal to a potential of the first voltage terminal under the control of the pull-down node. The at least one second pull-down sub-circuit is connected to the second control terminal, the pull-up node, the signal output terminal, and the first voltage terminal, and is configured to pull down potentials of the pull-up node and the signal output terminal to a potential of the first voltage terminal under the control of a signal from the second control terminal.

In some embodiments, the pull-up control circuit comprises a first transistor. A gate electrode and a first electrode of the first transistor are connected to the signal input terminal, and a second electrode of the first transistor is connected to the pull-up node.

In some embodiments, the pull-up circuit comprises a second transistor and a first capacitor. A gate electrode of the second transistor is connected to the pull-up node, a first electrode of the second transistor is connected to the clock signal terminal, and a second electrode of the second transistor is connected to the signal output terminal. One end of the first capacitor is connected to the pull-up node, and another end of the first capacitor is connected to the signal output terminal.

In some embodiments, the pull-down control circuit comprises a third transistor, a fourth transistor, a fifth transistor, and a sixth transistor. A gate electrode and a first electrode of the third transistor are connected to the first control terminal, and a second electrode of the third transistor is connected to a gate electrode of the fourth transistor and a first electrode of the fifth transistor; a first electrode of the fourth transistor is connected to the first control terminal, and a second electrode of the fourth transistor is connected to the pull-down node; a gate electrode of the fifth transistor is connected to the pull-up node, and a second electrode of the fifth transistor is connected to the first voltage terminal. A gate electrode of the sixth transistor is connected to the pull-up node, a first electrode of the sixth transistor is connected to the pull-down node, and a second electrode of the sixth transistor is connected to the first voltage terminal.

In some embodiments, the first pull-down sub-circuit comprises a seventh transistor and an eighth transistor. A gate electrode of the seventh transistor is connected to the pull-down node, a first electrode of the seventh transistor is connected to the pull-up node, and a second electrode of the seventh transistor is connected to the first voltage terminal; a gate electrode of the eighth transistor is connected to the pull-down node, a first electrode of the eighth transistor is connected to the signal output terminal, and a second electrode of the eighth transistor is connected to the first voltage terminal.

In some embodiments, each of the at least one second pull-down sub-circuit comprises a ninth transistor and a tenth transistor. A gate electrode of the ninth transistor is connected to the second control terminal, a first electrode of the ninth transistor is connected to the pull-up node, and a second electrode of the ninth transistor is connected to the first voltage terminal. A gate electrode of the tenth transistor is connected to the second control terminal, a first electrode of the tenth transistor is connected to the signal output terminal, and a second electrode of the tenth transistor is connected to the first voltage terminal.

In some embodiments, the reset circuit comprises an eleventh transistor. A gate electrode of the eleventh transistor is connected to the reset signal terminal, a first electrode of the eleventh transistor is connected to the pull-up node, and a second electrode of the eleventh transistor is connected to the first voltage terminal.

Some embodiments of the present disclosure provide a method of driving the shift register. In an image frame, the method comprises:

in an input phase, pulling up, by the pull-up control circuit, a potential of the pull-up node to a potential of a signal from the signal input terminal under the control of the signal from the signal input terminal; pulling down, by the pull-down control circuit, a potential of the pull-down node to a potential of the first voltage terminal under the control of the pull-up node and a signal from the first control terminal;

in an output phase, outputting, by the pull-up circuit, a signal of the clock signal terminal to the signal output terminal under the control of the pull-up node;

in a reset phase, pulling down, by the reset circuit, a potential of the pull-up node to a potential of the first voltage terminal under the control of a signal from the reset signal terminal; outputting, by the pull-down control circuit, a signal from the first control terminal to the pull-down node under the control of the signal from the first control terminal; and pulling down, by the pull-down circuit, potentials of the pull-up node and the signal output terminal to a potential of the first voltage terminal under the control of the pull-down node;

in a denoising phase, during a portion of the denoising phase, maintaining, by the pull-down control circuit and the pull-down circuit, potentials of the pull-up node and the signal output terminal at a potential of the first voltage terminal under the control of a signal from the first control terminal; during a remaining portion of the denoising phase, maintaining, by the pull-down circuit, potentials of the pull-up node and the signal output terminal at a potential of the first voltage terminal under the control of a signal from the second control terminal.

In some embodiments, the pull-down circuit comprises a first pull-down sub-circuit and a second pull-down sub-circuit.

An image frame comprises two time periods. In one of the time periods, a signal is input to the first control terminal in the denoising phase, so as to make the pull-down control circuit and the first pull-down sub-circuit maintain potentials of the pull-up node and the signal output terminal at a potential of the first voltage terminal under the control of the signal input to the first control terminal. In another time period, a signal is input to the second control terminal in the denoising phase, so as to make the second pull-down sub-circuit maintain potentials of the pull-up node and the signal output terminal at a potential of the first voltage terminal under the control of the second control terminal.

Some embodiments of the present disclosure provide a gate driving circuit, which comprises a plurality of shift registers connected in cascade.

A signal input terminal of a first-stage shift register is connected to a start signal terminal. Except for the first-stage shift register, a signal input terminal of each of remaining stages of shift registers is connected to a signal output terminal of a shift register in a previous stage.

Except for a last-stage shift register, a reset signal terminal of each of remaining stages of shift registers is connected to a signal output terminal of a shift register in a next stage. A reset signal terminal of the last-stage shift register is connected to the start signal terminal.

Adjacent stages of shift registers constitute a shift register group, and the gate driving circuit comprises M+1 shift register groups.

The gate driving circuit is connected to M+1 first control signal input terminals, wherein first control terminals of shift registers in different shift register groups are connected to different first control signal input terminals, and first control terminals of shift registers in the same shift register group are connected to the same first control signal input terminal.

The gate driving circuit is connected to M+1 second control signal input terminals, and each stage of shift registers is connected to M second control signal input terminals. Each stage of shift registers in the same shift register group is connected to the same M second control signal input terminals, and a second control signal input terminal that is not connected in different shift register groups is different. M is an integer and M≥1.

Some embodiments of the present disclosure provide a display device, which comprises the gate driving circuit described above.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
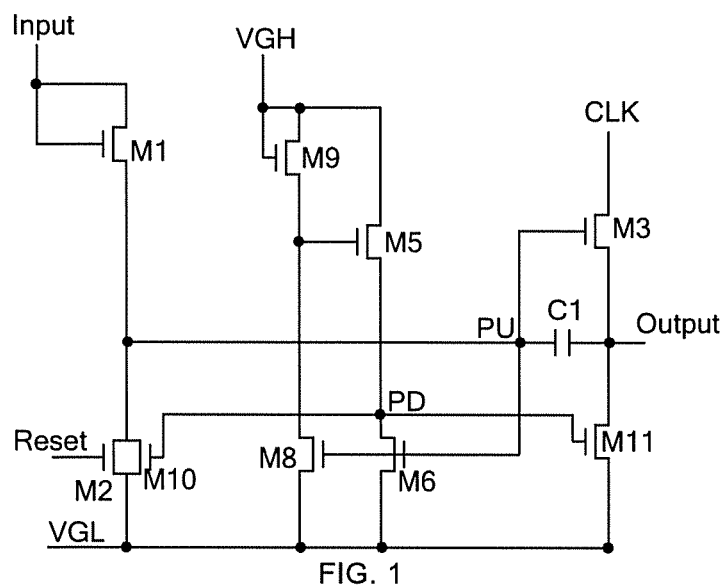
FIG. 1 is a circuit diagram of a shift register of a DC denoising scheme in the related art.

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

A driving circuit of a display includes a GOA circuit and a source driving circuit. The GOA circuit realizes the shift register function, which is to provide a pulse signal of a certain time width for all gate lines line by line in one frame, and the time width is generally one to several times the charging time allocated for each line. The waveform of the pulse signal is usually square wave. The source driving circuit will provide a correct video signal voltage for each pixel line by line in coordination with the generation time of the pulse signal provided to the gate line, so as to realize normal display of the image.

Generally, for ease of design and production, the GOA circuit will have a minimum GOA unit circuit (also known as a shift register). For small- and medium-sized display products, such as mobile phones and tablet computers, a single-side driving method is generally adopted. That is, each gate line is driven by one GOA unit circuit; odd-numbered rows of gate lines are driven from one side, and even-numbered rows of gate lines are driven from an opposite side; and the gate lines are driven from two sides alternately. For medium- and large-sized display products, such as notebooks, monitors and television sets, a double-side driving method is generally adopted. That is, each gate line is driven by two GOA unit circuits from the left and right sides respectively, and the GOA unit circuits on both sides simultaneously output identical pulse signals to the gate line to reduce the delay time of output. As can be seen from the above, during the operation, each GOA unit circuit outputs a pulse signal to a corresponding gate line in each frame.

Control signals of the GOA unit circuit include an enable signal (Input), a clock signal (CLK), a low level signal (VGL), a reset signal (Reset), and an optional high level signal (VGH), etc. The enable signal of a GOA unit circuit in a row is usually generated by a GOA unit circuit in a previous row. The system will provide a dedicated signal as the enable signal for the first one or several GOA unit circuits, and the dedicated signal is used to provide a pulse enable signal, generally known as an STV signal, for the GOA unit circuit(s) at the beginning of each frame.

An output signal is generally an output signal (Output) provided to the gate line. In addition, the output signal also serves as an enable signal for a GOA unit circuit in a row below and a reset signal for a GOA unit circuit in a row above. An output signal of a last GOA unit circuit does not need to serve as an enable signal. A reset signal of the last GOA unit circuit is provided by the system or a dedicated reset circuit. The reset circuit is generally composed of a plurality of transistors, and an occupied area of the reset circuit is usually smaller than an area of one GOA unit circuit. It will be noted that in some embodiments, the output signal is not used as an enable signal; instead, a separately generated signal is used as the enable signal.

In the GOA circuit, a boot-strapping structure is generally adopted. This kind of structure generally has two important nodes: a pull-up node and a pull-down node. The two nodes generally adopt a design structure in which each node is an inverter to another node.

Figure 2:
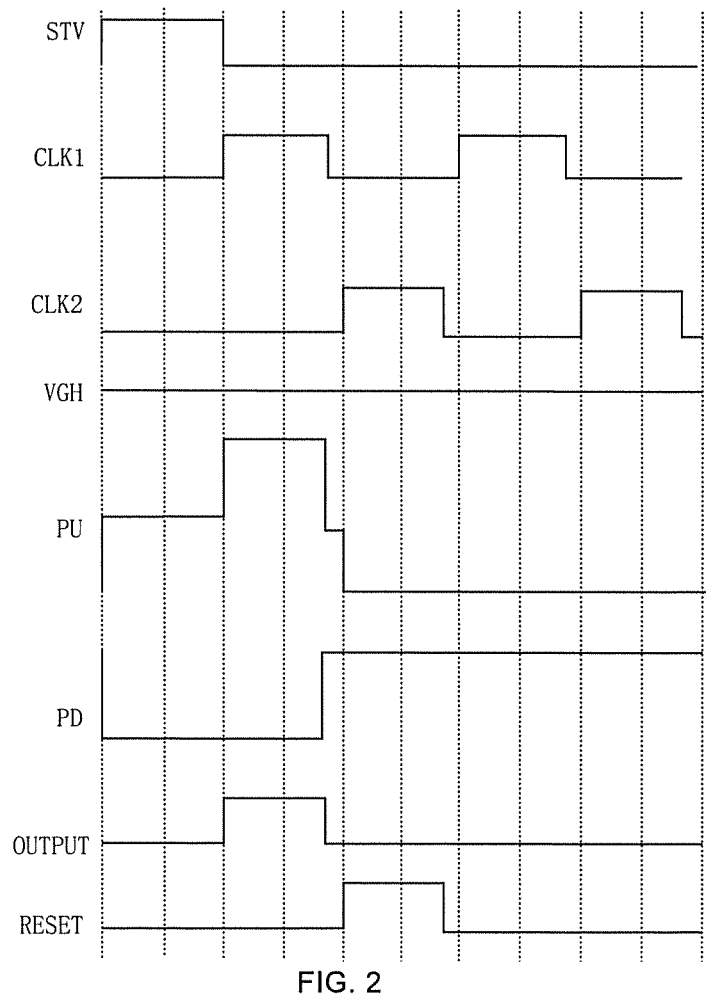
FIG. 2 is a timing diagram showing an operation of the shift register shown in FIG. 1.
Figure 3:
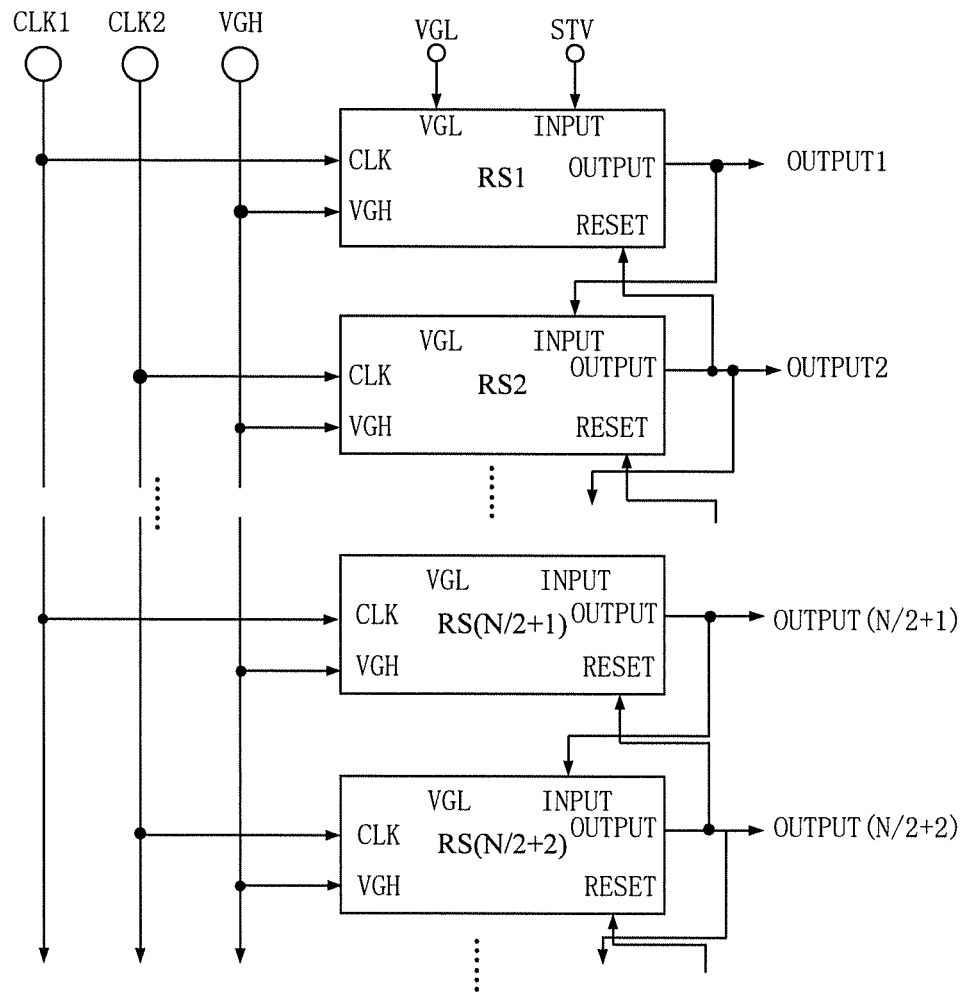
FIG. 3 is a schematic diagram showing a structure of a gate driving circuit formed by cascading a plurality of shift registers shown in FIG. 1.

FIG. 1 is a structural diagram of a GOA unit circuit in the related art; FIG. 2 is a timing diagram showing an operation of the GOA unit circuit shown in FIG. 1; and FIG. 3 is a diagram showing a structure of a gate driving circuit formed by cascading a plurality of GOA unit circuits shown in FIG. 1. As can be seen from FIGS. 2 and 3, after a GOA unit circuit outputs a gate line scanning signal, a GOA unit circuit of the next stage is required to output a gate line scanning signal to reset the pull-up node PU of the GOA unit circuit of the present stage. This is to avoid the situation that during a period of scanning other rows of gate lines in an image frame, when the clock signal CLK is at a high level, the GOA unit circuit of the present stage would output a gate line scanning signal to cause abnormal display of the frame.

It will be noted that the embodiments of the present disclosure are described by taking an example in which there are two clock signals CLK. The driving principle of the GOA unit circuit is the same when there are a plurality of clock signals CLK. In addition, the embodiments of the present disclosure are described by taking an example in which each transistor is an N-type transistor.

In the GOA unit circuit shown in FIG. 1, in a non-output stage of an image frame, the pull-down node PD is controlled by a high-level terminal VGH to jump from a low level to a high level, and potentials of the pull-up node PU and the signal output terminal Output is pulled down to a potential of the first voltage terminal VGL under the control of the pull-down node PD. Therefore, the noise of the pull-up node PU and the signal output terminal Output is removed, thereby achieving denoising of the pull-up node PU and the signal output terminal Output. The way in which the pull-down node PD is controlled by the high-level terminal VGH to achieve denoising is generally referred to as DC denoising.

DC denoising is disadvantageous in that since the high-level terminal VGH that controls the pull-down node PD is connected to a DC power supply, in the working phase of the GOA unit circuit, gate electrodes of a fifth transistor M5, a ninth transistor M9, a tenth transistor M10, and an eleventh transistor M11 are always maintained in a high voltage state except for a clock signal period in which the pull-up node PU is at a high level. It is known to those skilled in the art that a threshold voltage shift of a transistor is proportional to a duration in which the gate bias is applied to the transistor. If a gate electrode of the transistor is always in a high bias voltage state, a threshold voltage will quickly shift in the positive direction. As a result, the current is reduced when the transistor is turned on, and the stability of the GOA unit circuit is affected. The long-term bias voltage state of the gate electrode eventually leads to insufficient transistor current, which makes the GOA unit circuit not work properly. As a result, the gate driving circuit is easy to fail, which leads to a decrease in the service life of the gate driving circuit.

Figure 4:
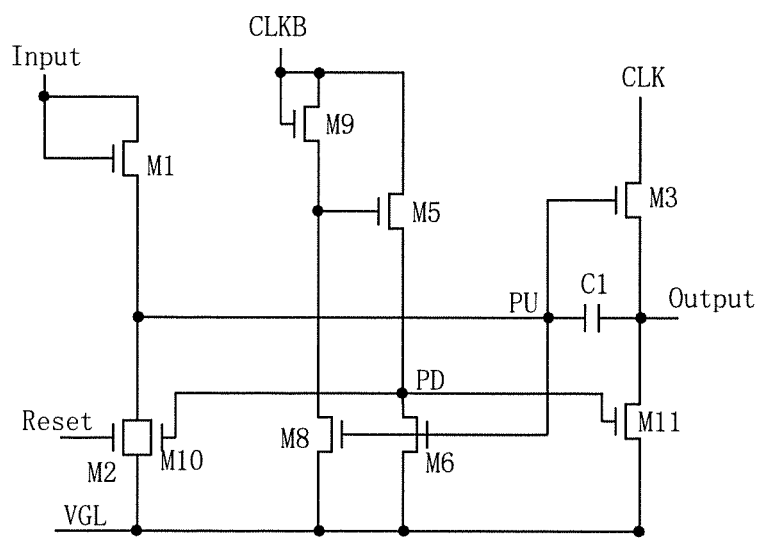
FIG. 4 is a circuit diagram of a shift register of a CLK denoising scheme in the related art.
Figure 5:
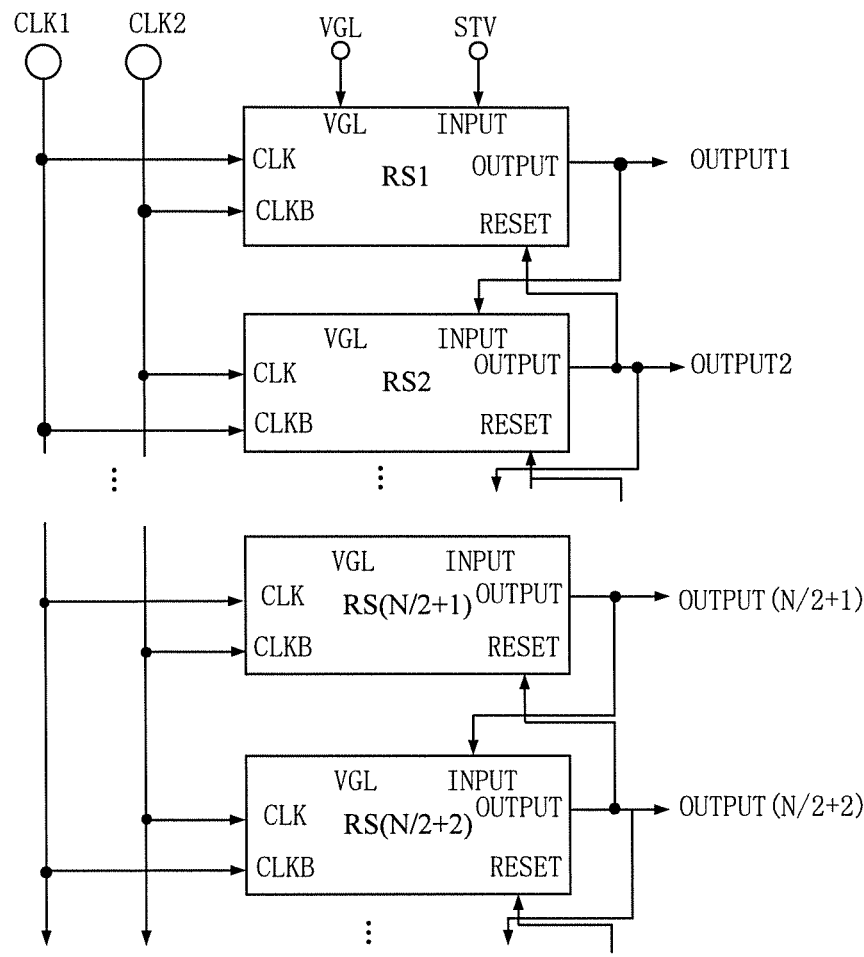
FIG. 5 is a schematic diagram showing a structure of a gate driving circuit formed by cascading a plurality of shift registers shown in FIG. 4.

In order to solve the problem that the threshold voltage shift of the transistor is severe in the GOA unit circuit shown in FIG. 1, which causes the gate driving circuit easy to fail and thereby cause a decrease in the service life of the gate driving circuit, the related art also provides a GOA unit circuit as shown in FIG. 4. FIG. 5 is a diagram showing a structure of a gate driving circuit formed by cascading a plurality of GOA unit circuits shown in FIG. 4. In the GOA unit circuit shown in FIG. 4, in a non-output phase of an image frame, the pull-down node PD is controlled by an inverted clock signal CLKB of the clock signal CLK. The manner in which the pull-down node PD is controlled by the inverted clock signal CLKB of the clock signal CLK to achieve denoising is generally referred to as CLK denoising.

On this basis, since the percentage of time the inverted clock signal CLKB is at high level is about 50%, in an image frame, the percentages of time the gate electrodes of the fifth transistor M5, the ninth transistor M9, the tenth transistor M10, and the eleventh transistor M11 are at high-level are about 50%. Compared with DC denoising, the percentage of time the gate electrodes of these transistors are at high level is reduced by about half from about 100%. Therefore, the threshold voltage shift of the transistors is greatly reduced. Therefore, the probability of failure of the GOA unit circuit may be reduced, the stability of the GOA unit circuit is improved, and the service life of the gate driving circuit is improved.

However, the CLK denoising is disadvantageous in that since the fifth transistor M5, the ninth transistor M9, the tenth transistor M10, and the eleventh transistor M11 all need to be charged through the inverted clock signal CLKB of the clock signal CLK, and the frequency at which the clock signal CLK is switched between high and low levels in an image frame is high, the transistors will be charged and discharged continuously. As a result, the power consumption of the GOA unit circuit and the gate driving circuit will be substantially increased.

Figure 6A:
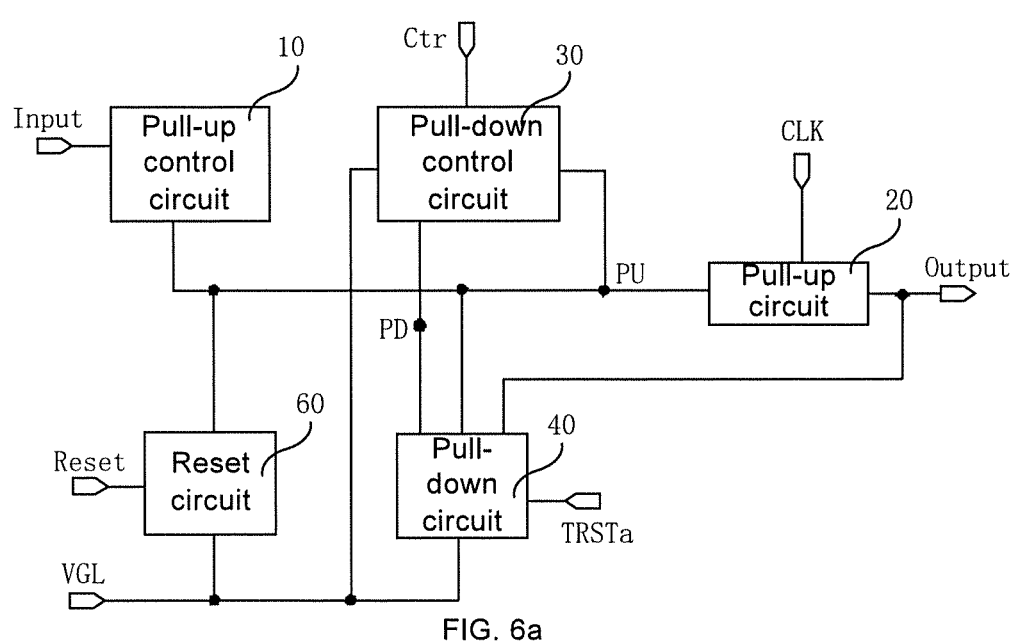
FIG. 6a is a schematic diagram showing a structure of a shift register according to some embodiments of the present disclosure.

For the above problem, some embodiments of the present disclosure provide a shift register which, as shown in FIG. 6a, includes a pull-up control circuit 10, a pull-up circuit 20, a pull-down control circuit 30, a pull-down circuit 40, and a reset circuit 60.

The pull-up control circuit 10 is connected to a signal input terminal Input and a pull-up node PU, and is configured to pull up a potential of the pull-up node PU to a potential of a signal from the signal input terminal Input under the control of the signal from the signal input terminal Input.

The pull-up circuit 20 is connected to the pull-up node PU, a clock signal terminal CLK and a signal output terminal Output, and is configured to output a signal of the clock signal terminal CLK to the signal output terminal Output under the control of the pull-up node PU.

The pull-down control circuit 30 is connected to a first control terminal Ctr, a pull-down node PD, a first voltage terminal VGL and the pull-up node PU, and is configured to pull down a potential of the pull-down node PD to a potential of the first voltage terminal VGL under the control of the pull-up node PU. Moreover, the pull-down control circuit 30 is further configured to output a signal from the first control terminal Ctr to the pull-down node PD under the control of the signal from the first control terminal Ctr.

The pull-down circuit 40 is connected to the pull-down node PD, the pull-up node PU, a second control terminal TRSTa, the first voltage terminal VGL and the signal output terminal Output, and is configured to pull down potentials of the pull-up node PU and the signal output terminal Output to a potential of the first voltage terminal VGL under the control of the pull-down node PD. Moreover, the pull-down circuit 40 is further configured to pull down potentials of the pull-up node PU and the signal output terminal Output to a potential of the first voltage terminal VGL under the control of a signal from the second control terminal TRSTa.

The reset circuit 60 is connected to a reset signal terminal Reset, the first voltage terminal VGL and the pull-up node PU, and is configured to pull down a potential of the pull-up node PU to a potential of the first voltage terminal VGL under the control of a signal from the reset signal terminal Reset.

When a plurality of the shift registers described in the above embodiments are cascaded to form a gate driving circuit, in an image frame, during an input phase of the shift register, the pull-up control circuit 10 pulls up a potential of the pull-up node PU to a potential of a signal from the signal input terminal Input under the control of the signal from the signal input terminal Input. Moreover, in the input phase, the pull-down control circuit 30 pulls down a potential of the pull-down node PD to a potential of the first voltage terminal VGL under the control of the pull-up node PU and the first control terminal Ctr. In an output phase of the shift register, the pull-up circuit 20 outputs a signal of a clock signal terminal CLK as a gate line scanning signal to a gate line connected to the signal output terminal Output under the control of the pull-up node PU. In a reset phase of the shift register, the reset circuit 60 pulls down a potential of the pull-up node PU to a potential of the first voltage terminal VGL under the control of a signal from the reset signal terminal Reset. The pull-down control circuit 30 outputs a signal from the first control terminal Ctr to the pull-down node PD under the control of the signal from the first control terminal Ctr, so that the pull-down circuit 40 pulls down potentials of the pull-up node PU and the signal output terminal Output to a potential of the first voltage terminal VGL under the control of the pull-down node PD.

On this basis, the plurality of shift registers described above are divided into two groups, that is, a first shift register group and a second shift register group. The first shift register group includes a plurality of shift registers connected in cascade in sequence, and the second shift register group includes a plurality of shift registers connected in cascade in sequence. The first shift register group is used to drive gate lines in an upper portion of a panel, and the second shift register group is used to drive gate lines in a lower portion of the panel. For the first shift register group, in a denoising phase of scanning a 1st half frame of an image frame, the pull-down control circuit 30 and the pull-down circuit 40 are maintained in a state in the reset phase, so that potentials of the pull-up node PU and the signal output terminal Output are maintained at a potential of the first voltage terminal VGL under the control of the pull-down node PD. For the first shift register group, when scanning a 2nd half frame of the image frame, the pull-down circuit 40 maintains the potentials of the pull-up node PU and the signal output terminal Output at the potential of the first voltage terminal VGL under the control of a signal from the second control terminal TRSTa. Therefore, the denoising of the pull-up node PU and the signal output terminal Output is achieved.

For the second shift register group, when scanning the 1st half frame of the image frame, the pull-down circuit 40 maintains the potentials of the pull-up node PU and the signal output terminal Output at the potential of the first voltage terminal VGL under the control of a signal from the second control terminal TRSTa. For the second shift register group, in the denoising phase of scanning the 2nd half frame of the image frame, the pull-down control circuit 30 is made to output a signal of the first control terminal Ctr to the pull-down node PD under the control of the signal of the first control terminal Ctr, so that the pull-down circuit 40 maintains the potentials of the pull-up node PU and the signal output terminal Output at the potential of the first voltage terminal VGL under the control of the pull-down node PD. That is, the pull-down control circuit 30 and the pull-down circuit 40 are maintained in a state in the reset phase, so that the potentials of the pull-up node PU and the signal output terminal Output are maintained at the potential of the first voltage terminal VGL under the control of a signal of the pull-down node PD. Therefore, the denoising of the pull-up node PU and the signal output terminal Output is achieved.

As can be seen from the above description, the first control terminal Ctr and the second control terminal TRSTa serve as control signal terminals for denoising the pull-up node PU and the signal output terminal Output. In an image frame, since effective signals of the first control terminal Ctr and the second control terminal TRSTa of the shift register only need to maintain for half a frame's time, the transistors for realizing the denoising function only need to work for half a frame's time, and the percentage of time the gate bias is applied to the transistors is approximately 50%. Compared with the situation that the percentage of time the gate bias is applied to the transistors in the DC denoising scheme is close to 100%, in the above situation, the threshold voltage shift of each transistor may be greatly reduced. Therefore, the probability of shift register failure due to threshold voltage shift is reduced, and thereby the service life and stability of the shift register and the gate driving circuit are improved. Moreover, since the effective signals of the first control terminal Ctr and the second control terminal TRSTa are both maintained for half a frame's time, the problem of the CLK denoising scheme that the high frequency at which the clock signal is switched between high and low levels may lead to high power consumption of the shift register may be avoided. Therefore, the power consumption of the shift register and the gate driving circuit may be substantially reduced.

Figure 6B:
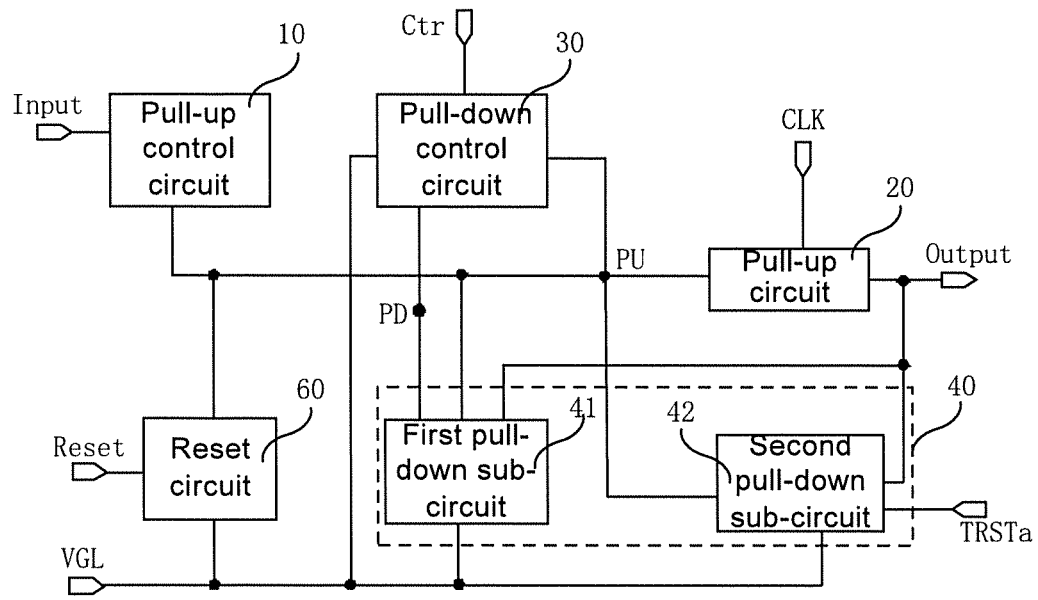
FIG. 6b is a schematic diagram showing a structure of another shift register according to some embodiments of the present disclosure.

In some embodiments, as shown in FIG. 6b, the pull-down circuit 40 includes a first pull-down sub-circuit 41 and a second pull-down sub-circuit 42.

The first pull-down sub-circuit 41 is connected to the pull-down node PD, the pull-up node PU, the first voltage terminal VGL, and the signal output terminal Output, and is configured to pull down potentials of the pull-up node PU and the signal output terminal Output to a potential of the first voltage terminal VGL under the control of the pull-down node PD.

The second pull-down sub-circuit 42 is connected to the second control terminal TRSTa, the pull-up node PU, the signal output terminal Output, and the first voltage terminal VGL, and is configured to pull down potentials of the pull-up node PU and the signal output terminal Output to a potential of the first voltage terminal VGL under the control of a signal from the second control terminal TRSTa.

The exemplary structure of each of the circuits mentioned above will be described in detail below with reference to FIG. 7.

The pull-up control circuit 10 includes a first transistor M1. The first transistor M1 includes a gate electrode, a first electrode, and a second electrode. The gate electrode and the first electrode of the first transistor M1 are connected to the signal input terminal Input, and the second electrode of the first transistor M1 is connected to the pull-up node PU.

The pull-up circuit 20 includes a second transistor M2 and a first capacitor C1. The second transistor M2 includes a gate electrode, a first electrode, and a second electrode. The gate electrode of the second transistor M2 is connected to the pull-up node PU, the first electrode of the second transistor M2 is connected to the clock signal terminal CLK, and the second electrode of the second transistor M2 is connected to the signal output terminal Output. One end of the first capacitor C1 is connected to the pull-up node PU, and another end of the first capacitor C1 is connected to the signal output terminal Output.

The pull-down control circuit 30 includes a third transistor M3, a fourth transistor M4, a fifth transistor M5, and a sixth transistor M6. The third transistor M3 includes a gate electrode, a first electrode, and a second electrode. The gate electrode and the first electrode of the third transistor M3 are connected to the first control terminal Ctr, and the second electrode of the third transistor M3 is connected to a gate electrode of the fourth transistor M4 and a first electrode of the fifth transistor M5. The fourth transistor M4 includes the gate electrode, a first electrode, and a second electrode. The first electrode of the fourth transistor M4 is connected to the first control terminal Ctr, and the second electrode of the fourth transistor M4 is connected to the pull-down node PD. The fifth transistor M5 includes a gate electrode, the first electrode, and a second electrode. The gate electrode of the fifth transistor M5 is connected to the pull-up node PU, and the second electrode of the fifth transistor M5 is connected to the first voltage terminal VGL. The sixth transistor M6 includes a gate electrode, a first electrode, and a second electrode. The gate electrode of the sixth transistor M6 is connected to the pull-up node PU, the first electrode of the sixth transistor M6 is connected to the pull-down node PD, and the second electrode of the sixth transistor M6 is connected to the first voltage terminal VGL.

The first pull-down sub-circuit 41 includes a seventh transistor M7 and an eighth transistor M8. The seventh transistor M7 includes a gate electrode, a first electrode, and a second electrode. The gate electrode of the seventh transistor M7 is connected to the pull-down node PD, the first electrode of the seventh transistor M7 is connected to the pull-up node PU, and the second electrode of the seventh transistor M7 is connected to the first voltage terminal VGL. The eighth transistor M8 includes a gate electrode, a first electrode, and a second electrode. The gate electrode of the eighth transistor M8 is connected to the pull-down node PD, the first electrode of the eighth transistor M8 is connected to the signal output terminal Output, and the second electrode of the eighth transistor M8 is connected to the first voltage terminal VGL.

The second pull-down sub-circuit 42 includes a ninth transistor M9 and a tenth transistor M10. The ninth transistor M9 includes a gate electrode, a first electrode, and a second electrode. The gate electrode of the ninth transistor M9 is connected to the second control terminal TRSTa, the first electrode of the ninth transistor M9 is connected to the pull-up node PU, and the second electrode of the ninth transistor M9 is connected to the first voltage terminal VGL. The tenth transistor M10 includes a gate electrode, a first electrode, and a second electrode. The gate electrode of the tenth transistor M10 is connected to the second control terminal TRSTa, the first electrode of the tenth transistor M10 is connected to the signal output terminal Output, and the second electrode of the tenth transistor M10 is connected to the first voltage terminal VGL.

The reset circuit 60 includes an eleventh transistor M11. The eleventh transistor M11 includes a gate electrode, a first electrode, and a second electrode. The gate electrode of the eleventh transistor M11 is connected to the reset signal terminal Reset, the first electrode of the eleventh transistor M11 is connected to the pull-up node PU, and the second electrode of the eleventh transistor M11 is connected to the first voltage terminal VGL.

In some embodiments, the transistors described above (i.e., from the first transistor M1 to the eleventh transistor M11) are all P-type transistors, in which case the low level signal is a valid signal. In some other embodiments, the transistors described above are all N-type transistors, in which case the high level signal is a valid signal.

In some embodiments, the first electrode of one of the transistors is a source electrode and the second electrode is a drain electrode. In some other embodiments, the first electrode is a drain electrode and the second electrode is a source electrode.

Figure 8:
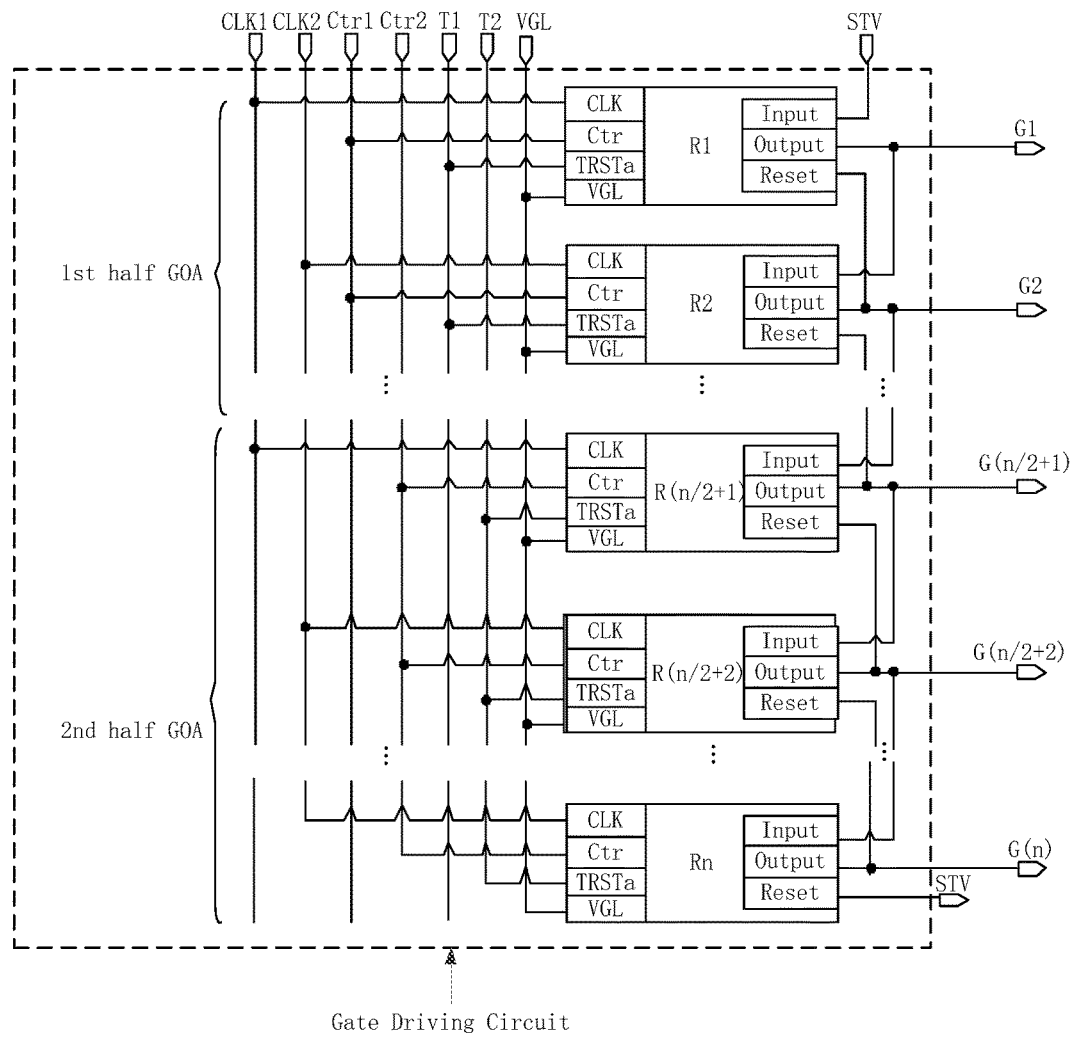
FIG. 8 is a schematic diagram showing a structure of a gate driving circuit formed by cascading a plurality of shift registers shown in FIG. 7 according to some embodiments of the present disclosure.
Figure 9A:
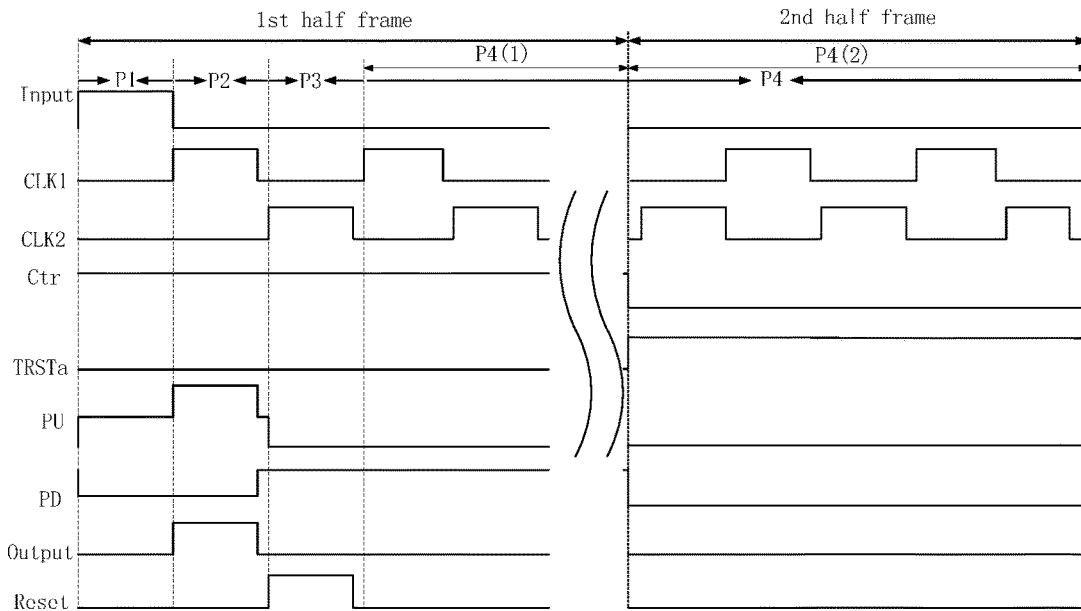
FIG. 9a is a timing diagram showing an operation of a first shift register group in the gate driving circuit shown in FIG. 8.
Figure 9B:
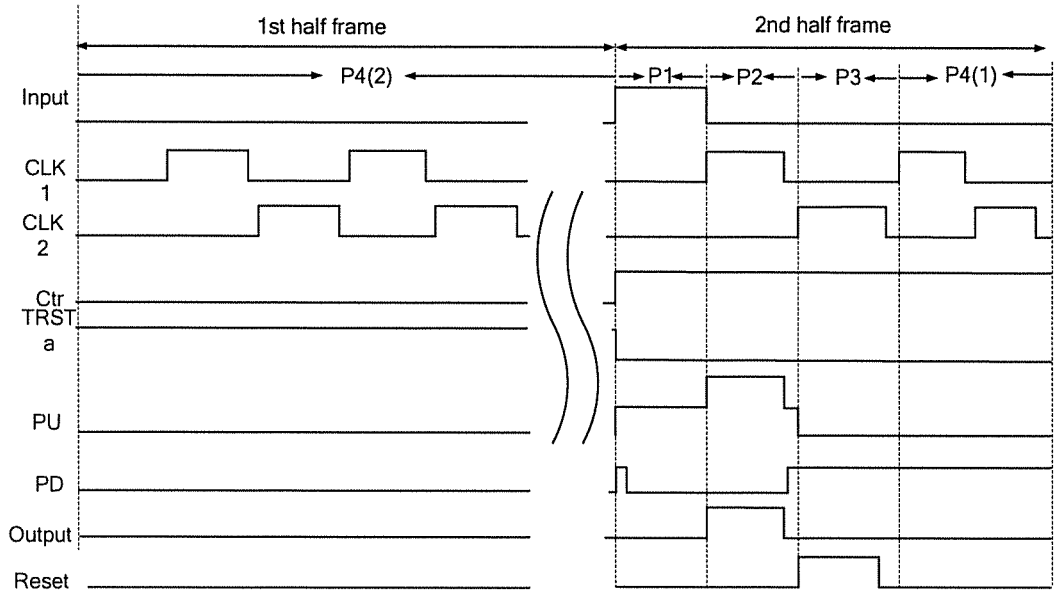
FIG. 9b is a timing diagram showing an operation of a second shift register group in the gate driving circuit shown in FIG. 8.

The operation of the shift register shown in FIG. 7 in an image frame will be illustrated below with reference to FIGS. 9a and 9b. Hereinafter, an explanation will be given by taking an example in which each transistor is an N-type transistor and the first voltage terminal VGL outputs a constant low level. A gate driving circuit as shown in FIG. 8 is formed by cascading the shift registers described above. Assuming that there are n stages of shift registers, and n is an even number, then FIG. 9a is a timing diagram showing an operation of the first shift register group (1st stage–n/2th stage). For example, FIG. 9a is a timing diagram showing an operation of the first-stage shift register. FIG. 9b is a timing diagram showing an operation of the second shift register group ((n/2+1)th stage–nth stage). For example, FIG. 9b is a timing diagram showing an operation of the (n/2+1)th-stage shift register.

As shown in FIGS. 9a and 9b, in an image frame, the working process of a shift register includes the following phases.

In the input phase P1:

A high level is input via the signal input terminal Input, and the first transistor M1 is turned on under the control of the high level from the signal input terminal Input. The high level of the signal input terminal Input is output to the pull-up node PU through the first transistor M1, and then stored in the first capacitor C1.

Under the control of the pull-up node PU, the fifth transistor M5 and the sixth transistor M6 are turned on, and a potential of the gate electrode of the fourth transistor M4 is pulled down to a low level of the first voltage terminal VGL through the fifth transistor M5. The third transistor M3 is turned on under the control of the high level of the first control terminal Ctr. By setting width to length ratios of the third transistor M3 and the fifth transistor M5 (the width to length ratio of the fifth transistor M5 is greater than the width to length ratio of the third transistor M3), and width to length ratios of the fourth transistor M4 and the sixth transistor M6 (the width to length ratio of the sixth transistor M6 is greater than the width to length ratio of the fourth transistor M4), a potential of the pull-down node PD will be pulled down to a low level of the first voltage terminal VGL. Since the potential of the pull-down node PD is at a low level, the seventh transistor M7 and the eighth transistor M8 are cut off. Since a potential of the reset signal terminal Reset is at a low level, the eleventh transistor M11 is cut off.

At the same time, the second transistor M2 is turned on under the control of the pull-up node PU. The low level of the clock signal terminal CLK is output to the signal output terminal Output through the second transistor M2. It can be seen that in the input phase P1, the signal output terminal Output does not output a gate line scanning signal.

In the output phase P2:

A low level is input via the signal input terminal Input, and the first transistor M1 is cut off. Under the bootstrap action of the first capacitor C1, a potential of the pull-up node PU remains at a high level, thereby keeping the second transistor M2 in a turned-on state. The clock signal terminal CLK outputs a high level signal, and the high level signal is output to the signal output terminal Output through the second transistor M2, so as to make the signal output terminal Output output a gate line scanning signal. Since a potential of the high level signal output from the clock signal terminal CLK is greater than the potential of the pull-up node PU, the potential of the pull-up node PU will be further pulled up under the bootstrap action of the first capacitor C1. The turned-on and cut-off states of other transistors remain the same as in the input phase P1.

As shown in FIGS. 9a and 9b, since there is a certain delay between the high levels of clock signals CLK1 and CLK2, before a reset signal arrives, when a signal of the clock signal CLK1 is at a low level, the low level of the clock signal CLK1 is output to the signal output terminal Output through the second transistor M2. Under the bootstrap action of the first capacitor C1, a potential of the pull-up node PU is pulled down.

In the reset phase P3:

A low level is input via the signal input terminal Input, and the first transistor M1 is cut off. A high level is input via the reset signal terminal Reset, and the eleventh transistor M11 is turned on under the control of the high level of the reset signal terminal Reset. The potential of the pull-up node PU is pulled down to the low level of the first voltage terminal VGL through the eleventh transistor M11. When the potential of the pull-up node PU is pulled down to a low level, the second transistor M2, the fifth transistor M5, and the sixth transistor M6 are cut off. Under the control of the high level of the first control terminal Ctr, the third transistor M3 is turned on; and the high level of the first control terminal Ctr is output to the gate electrode of the fourth transistor M4 through the third transistor M3, so as to turn on fourth transistor M4. The high level of the first control terminal Ctr is output to the pull-down node PD through the fourth transistor M4. Under the control of the high level of the pull-down node PD, the seventh transistor M7 and the eighth transistor M8 are turned on. The potential of the pull-up node PU is maintained at the low level of the first voltage terminal VGL through the seventh transistor M7, and the potential of the signal output terminal Output is maintained at the low level of the first voltage terminal VGL through the eighth transistor M8, thereby achieving denoising of the pull-up node PU and the signal output terminal Output.

In the denoising phase P4:

For the first shift register group, as shown in FIG. 9a, the denoising phase P4 includes a portion of a period of scanning the 1st half frame of an image frame P4(1) and an entire period of scanning the 2nd half frame of the image frame P4(2). For the second shift register group, as shown in FIG. 9b, the denoising phase P4 includes an entire period of scanning the 1st half frame of the image frame P4(2) and a portion of a period of scanning the 2nd half frame of the image frame P4 (1).

During the P4(1) period, as shown in FIGS. 9a and 9b, under the control of the high level of the first control terminal Ctr, the third transistor M3, the fourth transistor M4, the seventh transistor M7 and the eighth transistor M8 are maintained in a state in the reset phase P3. Therefore, the potentials of the pull-up node PU and the signal output terminal Output are maintained at the low level of the first voltage terminal VGL, thereby achieving denoising of the pull-up node PU and the signal output terminal Output. At this time, since a signal output from a second control terminal TRSTa is at a low level, the ninth transistor M9 and the tenth transistor M10 are cut off.

During the P4 (2) period, since a signal output from the first control terminal Ctr is at a low level, the third transistor M3 is cut off. Moreover, since the potential of the pull-up node PU is at a low level, the fifth transistor M5 and the sixth transistor M6 are cut off. Therefore, the potential of the pull-down node PD is in a floating state, and accordingly, the gate electrodes of the seventh transistor M7 and the eighth transistor M8 are also in a floating state, and the seventh transistor M7 and the eighth transistor M8 are cut off. A high level is output from the second control terminal TRSTa, and the ninth transistor M9 and the tenth transistor M10 are turned on under the control of the high level of the second control terminal TRSTa. The potential of the pull-up node PU is maintained at the low level of the first voltage terminal VGL through the ninth transistor M9, and the potential of the signal output terminal Output is maintained at the low level of the first voltage terminal VGL through the tenth transistor M10, thereby achieving denoising of the pull-up node PU and the signal output terminal Output.

In summary, the high level of the first control terminal Ctr and the second control terminal TRSTa only need to maintain for half a frame's time in an image frame, whether in the first shift register group or in the second shift register group. Therefore, the percentage of the time gate bias is applied to the transistors M3, M4, M7, M8, M9, M10 are approximately 50%, that is, the transistors M3, M4, M7, M8, M9, M10 only need to work for half a frame's time. Compared with DC denoising, the threshold voltage shift of the transistor is reduced, and the service life and stability of the shift register are improved. Moreover, since the effective signals of the first control terminal Ctr and the second control terminal TRSTa are both maintained for half a frame's time, the problem of the CLK denoising scheme that the high frequency at which the clock signal is switched between high and low levels may lead to high power consumption of the shift register may be avoided.

It will be noted that in the embodiments of the present disclosure, the fabrication process of each transistor is not limited. For example, the transistor may be fabricated through one of an amorphous silicon (a-Si) process, an oxide (Oxide) process, a low temperature polysilicon (LTPS) process, a high temperature polysilicon (HIPS) process, etc.

Figure 10:
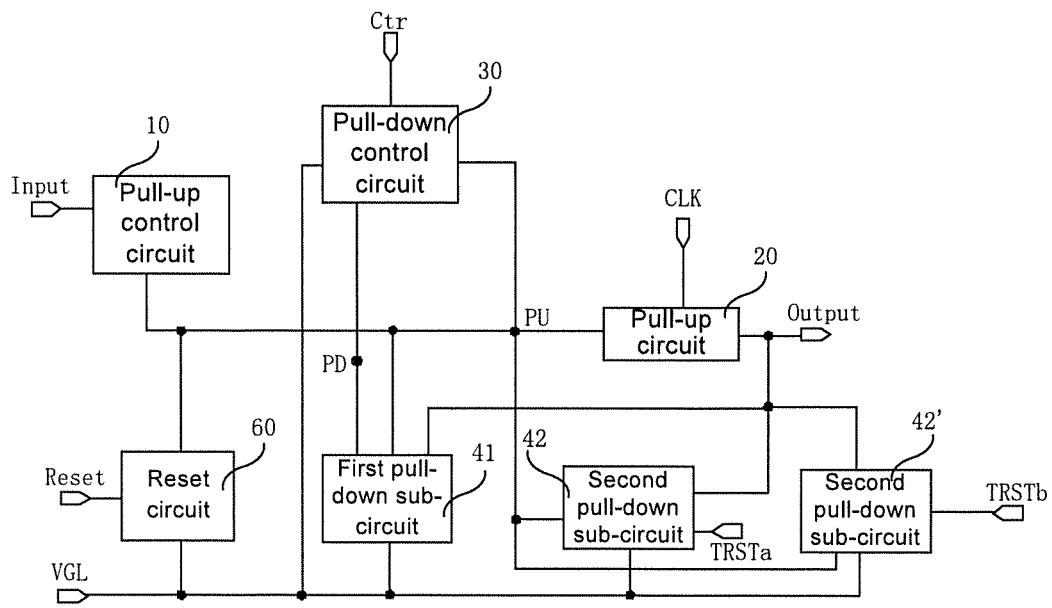
FIG. 10 is a schematic diagram showing a structure of another shift register according to some embodiments of the present disclosure.

Some embodiments of the present disclosure provide a shift register as shown in FIG. 10. Unlike the shift register provided in the above embodiments, this shift register includes two second pull-down sub-circuits, i.e., a second pull-down sub-circuit 42 and a second pull-down sub-circuit 42'.

The second pull-down sub-circuit 42' is connected to the second control terminal TRSTb, the pull-up node PU, the signal output terminal Output and the first voltage terminal VGL, and is configured to pull down potentials of the pull-up node PU and the signal output terminal Output to a potential of the first voltage terminal VGL under the control of a signal from the second control terminal TRSTb.

Figure 11:
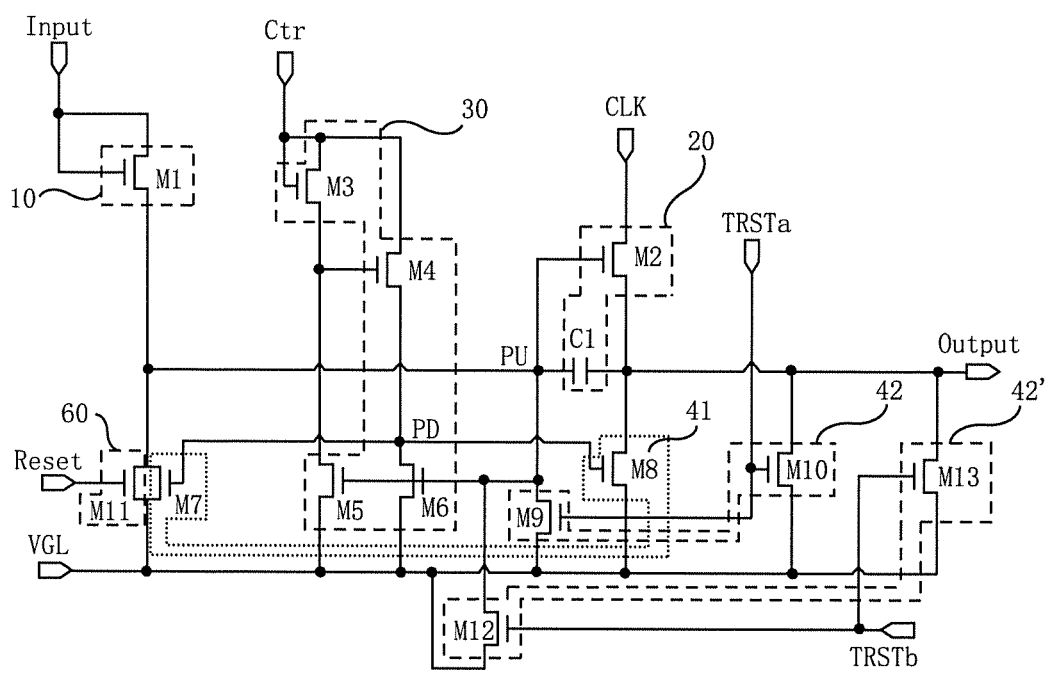
FIG. 11 is a circuit diagram of the shift register shown in FIG. 10.

In some embodiments, the circuit structure of the second pull-down sub-circuit 42' is as shown in FIG. 11. The second pull-down sub-circuit 42' includes a twelfth transistor M12 and a thirteenth transistor M13.

The twelfth transistor M12 includes a gate electrode, a first electrode, and a second electrode. The gate electrode of the twelfth transistor M12 is connected to the second control terminal TRSTb, the first electrode of the twelfth transistor M12 is connected to the pull-up node PU, and the second electrode of the twelfth transistor M12 is connected to the first voltage terminal VGL.

The thirteenth transistor M13 includes a gate electrode, a first electrode, and a second electrode. The gate electrode of the thirteenth transistor M13 is connected to the second control terminal TRSTb, the first electrode of the thirteenth transistor M13 is connected to the signal output terminal Output, and the second electrode of the thirteenth transistor M13 is connected to the first voltage terminal VGL.

Figure 12:
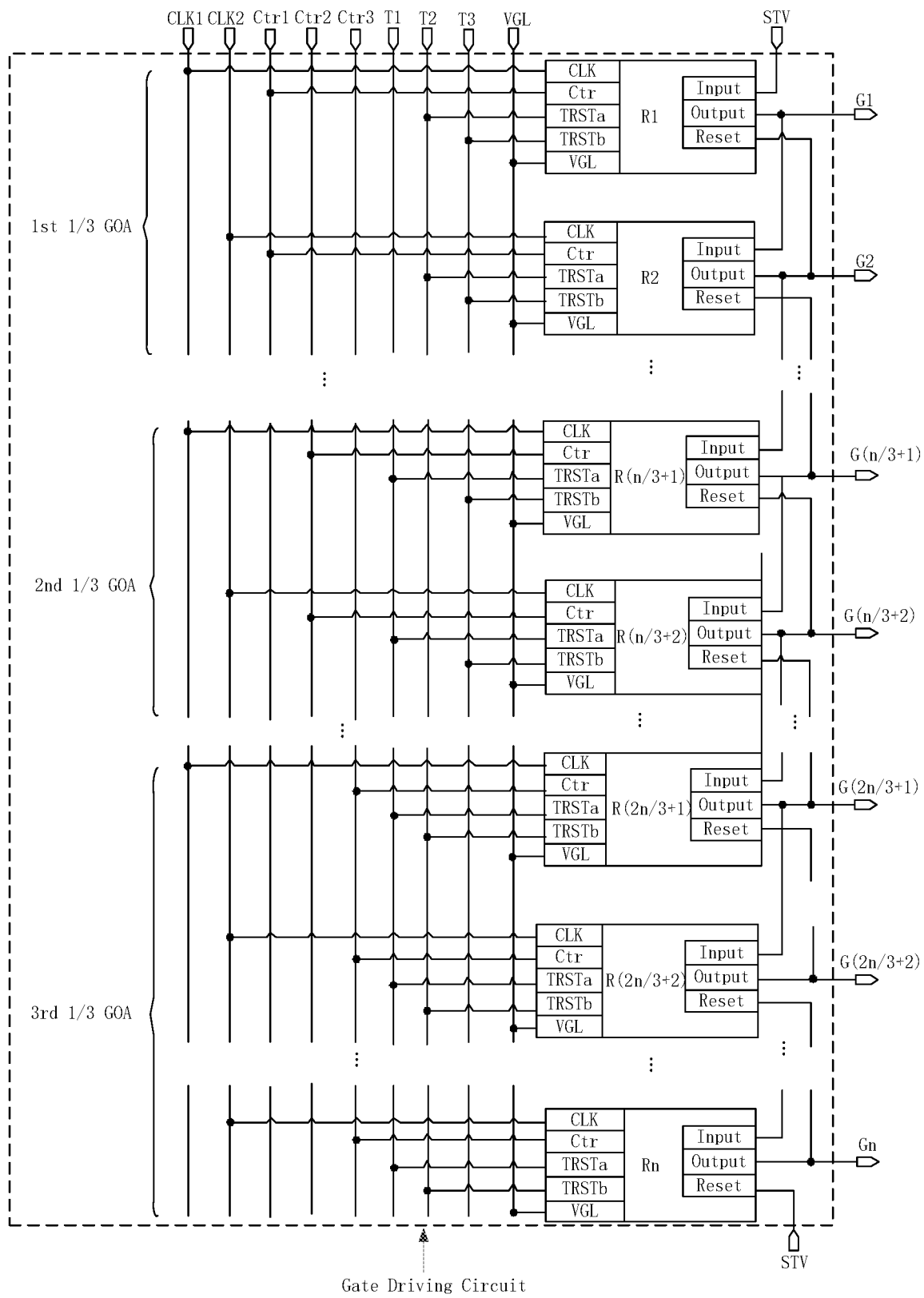
FIG. 12 is a schematic diagram showing a structure of a gate driving circuit formed by cascading a plurality of shift registers shown in FIG. 11 according to some embodiments of the present disclosure.

In some embodiments, when a plurality of the shift registers (as shown in FIG. 10) are cascaded to form a gate driving circuit as shown in FIG. 12, the plurality of shift registers are divided into three groups, that is, a first shift register group, a second shift register group, and a third shift register group. The first shift register group includes a plurality of shift registers connected in cascade in sequence, the second shift register group includes a plurality of shift registers connected in cascade in sequence, and the third shift register group includes a plurality of shift registers connected in cascade in sequence. The first shift register group is used to drive gate lines in an upper portion of the panel, the second shift register group is used to drive gate lines in a middle portion of the panel, and the third shift register group is used to drive gate lines in a lower portion of the panel. In an image frame, the operating principle of the input phase P1, the output phase P2, and the reset phase P3 is the same as that of the shift register provided in FIG. 6b, and will not be repeated herein.

Figure 13A:
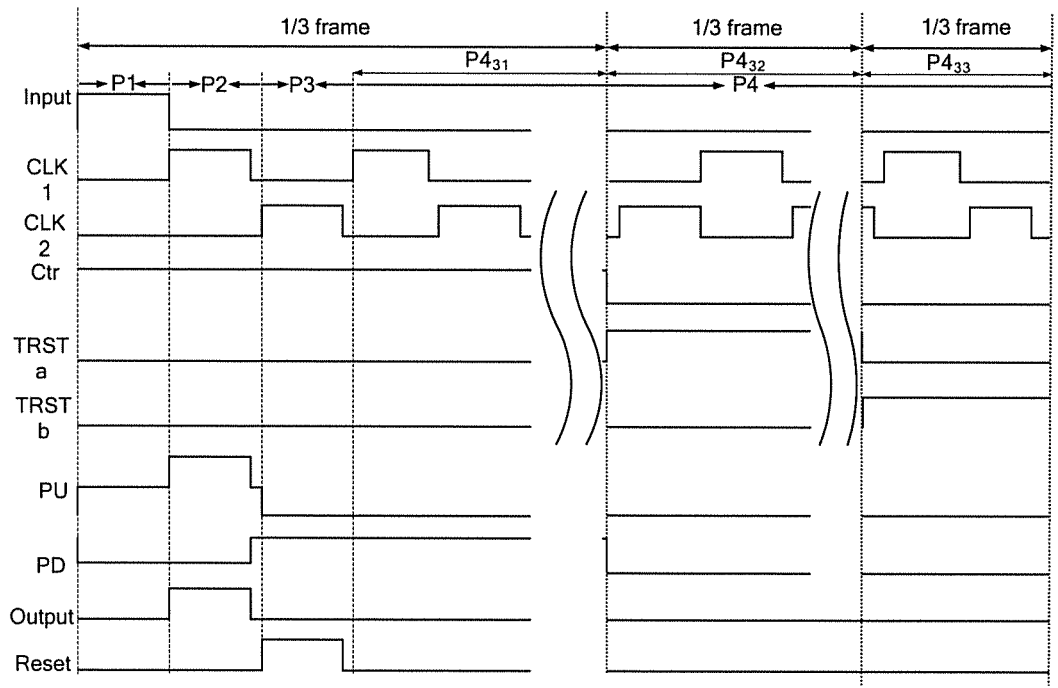
FIG. 13a is a timing diagram showing an operation of a first shift register group in the gate driving circuit shown in FIG. 12.
Figure 13B:
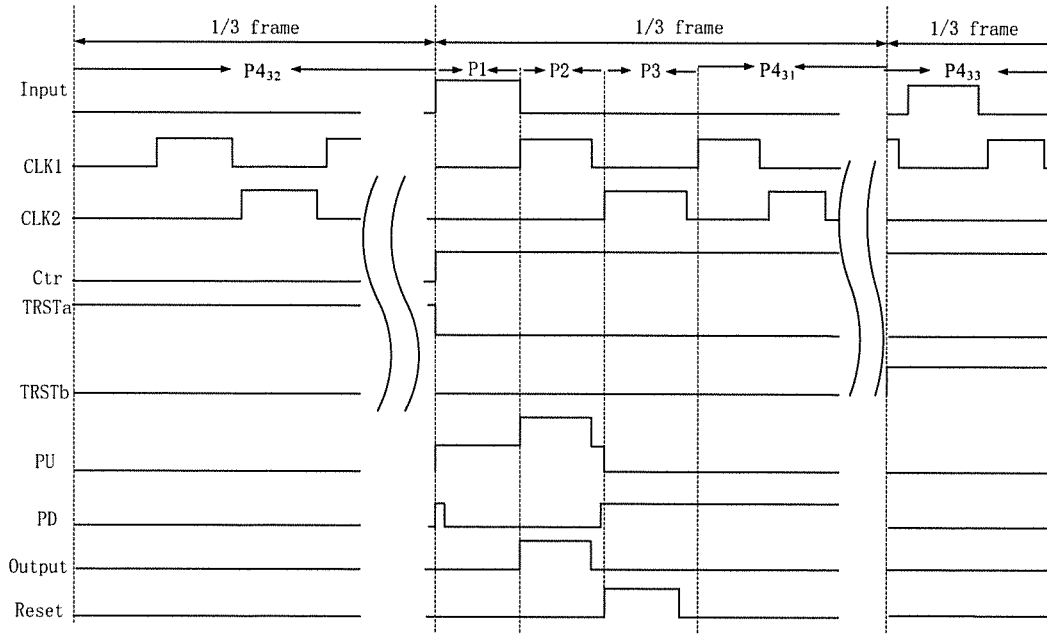
FIG. 13b is a timing diagram showing an operation of a second shift register group in the gate driving circuit shown in FIG. 12.

For shift registers in the first shift register group, as shown in FIG. 13a, the denoising phase P4 includes a portion of a period of scanning the front ⅓ frame of an image frame $P4_{31}$, an entire period of scanning the middle ⅓ frame of the image frame $P4_{32}$, and an entire period of scanning the last ⅓ frame of the image frame $P4_{33}$. For shift registers in the second shift register group, as shown in FIG. 13b, the denoising phase P4 includes an entire period of scanning the front ⅓ frame of an image frame $P4_{32}$, a portion of a period of scanning the middle ⅓ frame of the image frame $P4_{31}$, and an entire period of scanning the last ⅓ frame of the image frame $P4_{33}$. For shift registers in the third shift register group, as shown in FIG. 13c, the denoising phase P4 includes an entire period of scanning the front ⅓ frame of an image frame $P4_{32}$, an entire period of scanning the middle ⅓ frame of the image frame $P4_{33}$, and a portion of a period of scanning the last ⅓ frame of the image frame $P4_{31}$.

Figure 13C:
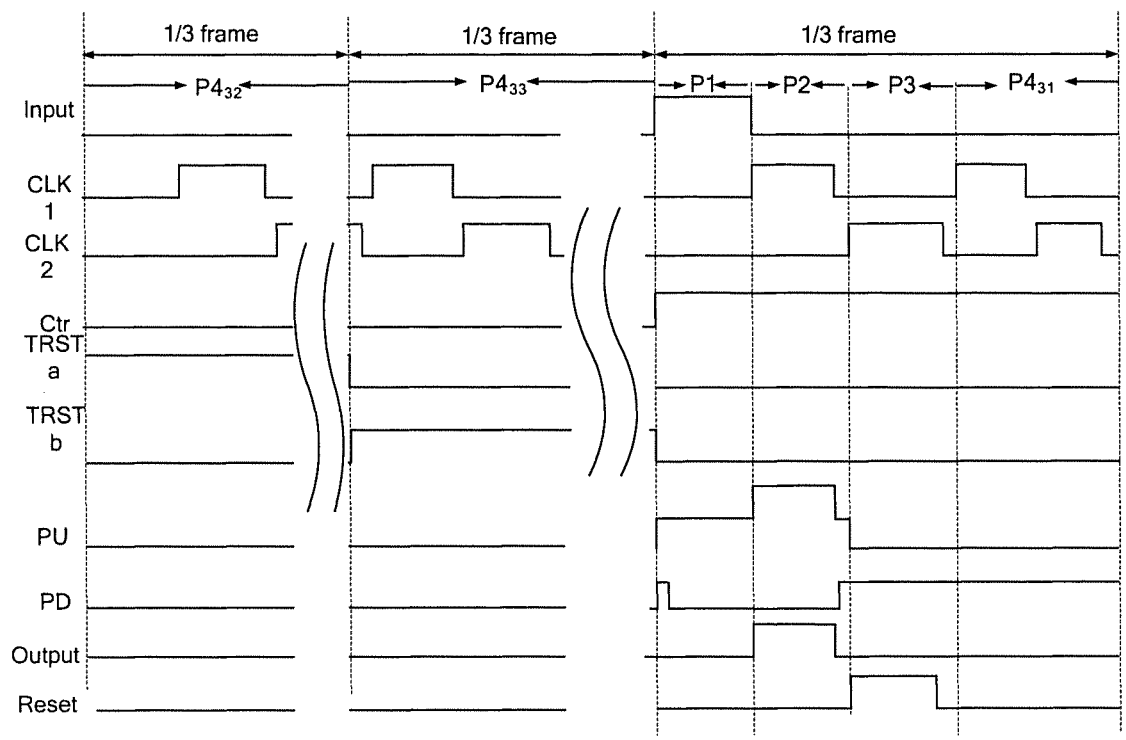
FIG. 13c is a timing diagram showing an operation of a third shift register group in the gate driving circuit shown in FIG. 12.

As shown in FIGS. 13a to 13c, during the $P4_{31}$ period, the pull-down control circuit 30 and the first pull-down sub-circuit 41 maintains a state in the reset phase P3, so that potentials of the pull-up node PU and the signal output terminal Output maintain at a low level of the first voltage terminal VGL under the control of the high level of the pull-down node PD, thereby achieving denoising of the pull-up node PU and the signal output terminal Output. During this period, a low level signal is input to the second control terminal TRSTa and the second control terminal TRSTb, so that the second pull-down sub-circuits 42 and 42' do not work.

During the $P4_{32}$ period, the second pull-down sub-circuit 42 maintains potentials of the pull-up node PU and the signal output terminal Output at a low level of the first voltage terminal VGL under the control of the high level of the second control terminal TRSTa, thereby achieving denoising of the pull-up node PU and the signal output terminal Output. During this period, a low level signal is input to the first control terminal Ctr and the second control terminal TRSTb, so that the second pull-down sub-circuit 42', the pull-down control circuit 30, and the first pull-down sub-circuit 41 do not work.

During the $P4_{33}$ period, the second pull-down sub-circuit 42' maintains the potentials of the pull-up node PU and the signal output terminal Output at the low level of the first voltage terminal VGL under the control of the high level of the second control terminal TRSTb, thereby achieving denoising of the pull-up node PU and the signal output terminal Output. During this period, a low level signal is input to the first control terminal Ctr and the second control terminal TRSTa, so that the second pull-down sub-circuit 42, the pull-down control circuit 30, and the first pull-down sub-circuit 41 do not work.

Based on this, in the shift register provided by the embodiments of the present disclosure, the first control terminal Ctr, the second control terminal TRSTa, and the second control terminal TRSTb are used as denoising control signal terminals. In an image frame, since the high level signals of the first control terminal Ctr, the second control terminal TRSTa, and the second control terminal TRSTb of the shift register only need to maintain for one-third of an image frame's time, the transistors used for realizing the denoising function only need to work for one-third of an image frame's time, and the percentage of time the gate bias is applied to each of the transistors is approximately 33%. Compared with the 50% time of each transistor, in this situation, the threshold voltage shift of each transistor may be further reduced. Therefore, the service life and stability of the shift register and the gate driving circuit may be further improved.

In addition, by increasing the number of the second pull-down sub-circuits in the shift register, the service time and stability of the shift register and the gate driving circuit may be further improved, and the power consumption of the shift register may be reduced. It will be understood that if the number of second pull-down sub-circuits is 3, the percentage of time the gate bias is applied to each transistor is about 25% based on the same principle as when the number of second pull-down sub-circuits is 2.

Of course, when the number of second pull-down sub-circuits in the shift register increases, the number of denoising control signal terminals will also increase, which causes the number of driving ICs for providing control signals and control signal lines to increase, thereby resulting increased control signal line costs and higher complexity of the shift register. In addition, adding second pull-down sub-circuits will result in an increase in the area of the shift register. Since the shift register is placed in a bezel area of a display, the increase in the area of the shift register goes against the narrow bezel development trend of displays.

Figure 7:
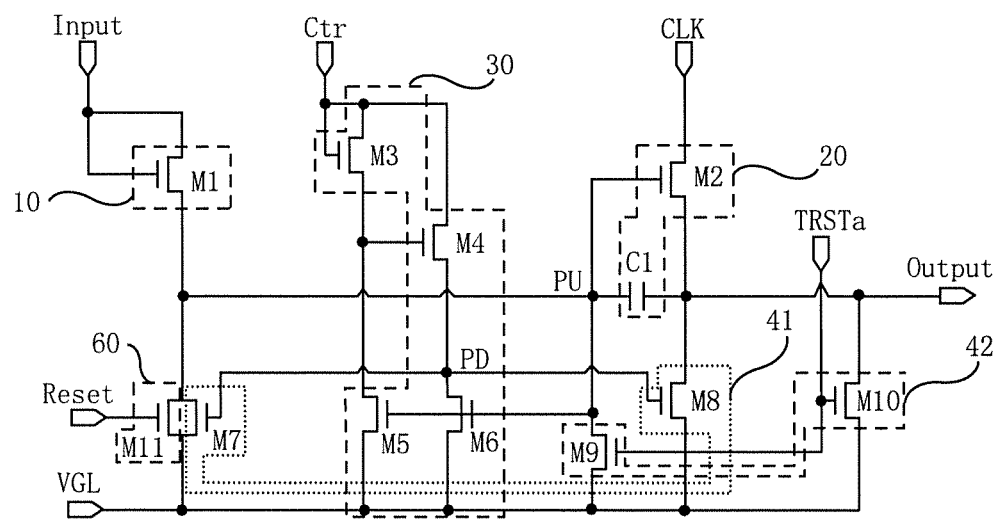
FIG. 7 is a circuit diagram of a shift register shown in FIG. 6b according to some embodiments of the present disclosure.

In summary, considering the stability of the gate driving circuit, the complexity of lines, and the manufacturing cost of the display, in some embodiments, as shown in FIGS. 6b and 7, the shift register includes a single second pull-down sub-circuit.

It will be noted that when the shift register includes more than two second pull-down sub-circuits, the structure of the shift register can be known to those skilled in the art with reference to the specific structure and connection manner of the shift register in which a single second pull-down sub-circuit 42 is provided, or in which one second pull-down sub-circuit 42 and one second pull-down sub-circuit 42' are provided, and thus will not be described herein.

Some embodiments of the present disclosure provide a method of driving a shift register. As shown in FIG. 6b, the shift register includes a second pull-down sub-circuit 42.

Referring to FIGS. 9a and 9b, in an image frame, the method includes the following steps.

In the input phase P1: Input=1, CLK=CLK1=0, Ctr=1, TRSTa=0, PU=1, PD=0, Output=0. 0 represents a low level and 1 represents a high level.

The pull-up control circuit 10 pulls up a potential of the pull-up node PU to a potential of a signal from the signal input terminal Input under the control of the signal from the signal input terminal Input. The pull-down control circuit 30 pulls down a potential of the pull-down node PD to a potential of the first voltage terminal VGL under the control of the potentials of the pull-up node PU and the first control terminal Ctr.

Referring to the circuit diagram of the shift register shown in FIG. 7, since a high level is input via the signal input terminal Input, the first transistor M1 is turned on under the control of the high level of the signal input terminal Input. The high level of the signal input terminal Input is output to the pull-up node PU through the first transistor M1, and the high level of the signal input terminal Input is stored in the first capacitor C1.

Under the control of the pull-up node PU, the fifth transistor M5 and the sixth transistor M6 are turned on; and a potential of the gate electrode of the fourth transistor M4 is pulled down to a low level of the first voltage terminal VGL through the fifth transistor M5. Under the control of the high level of the first control terminal Ctr, the third transistor M3 is turned on. By setting width to length ratios of the third transistor M3 and the fifth transistor M5 (the width to length ratio of the fifth transistor M5 is greater than the width to length ratio of the third transistor M3), and width to length ratios of the fourth transistor M4 and the sixth transistor M6 (the width to length ratio of the sixth transistor M6 is greater than the width to length ratio of the fourth transistor M4), a potential of the pull-down node PD will be pulled down to a low level of the first voltage terminal VGL. Since the potential of the pull-down node PD is at a low level, the seventh transistor M7 and the eighth transistor M8 are cut off. Since the potential of the reset signal terminal Reset is at a low level, the eleventh transistor M11 is cut off.

Under the control of the pull-up node PU, the second transistor M2 is turned on. The low level of the clock signal terminal CLK is output to the signal output terminal Output through the second transistor M2. It can be seen that in the input phase P1, a gate line scanning signal is not output from the signal output terminal Output.

In the output phase P2: Input=0, CLK=CLK1=1, Ctr=1, TRSTa=0, PU=1, PD=0, Output=1.

The pull-up circuit 20 outputs a signal from the clock signal terminal CLK to the signal output terminal Output under the control of the pull-up node PU.

Referring to the circuit diagram of the shift register shown in FIG. 7, since a low level is input via the signal input terminal Input, the first transistor M1 is cut off. Under the bootstrap action of the first capacitor C1, the potential of the pull-up node PU remains at a high level, thereby keeping the second transistor M2 in a turned-on state. A high level signal is output from the clock signal terminal CLK, and then output to the signal output terminal Output through the second transistor M2, so that a gate line scanning signal is output from the signal output terminal Output. Since a potential of a high level signal output from the clock signal terminal CLK is greater than the potential of the pull-up node PU, the potential of the pull-up node PU will be further pulled up under the bootstrap action of the first capacitor C1. The turned-on and cut-off states of other transistors remain the same as in the input phase P1.

As shown in FIGS. 9a and 9b, since there is a certain delay between high levels of adjacent clock signals of the clock signal terminals CLK1 and CLK2, before the reset signal arrives, when a signal of the clock signal terminal CLK1 is at a low level, the low level of the clock signal terminal CLK1 will be output to the signal output terminal Output through the second transistor M2. Under the bootstrap action of the first capacitor C1, the potential of the pull-up node PU is pulled down.

In the reset phase P3: Input=0, CLK=CLK1=0, Ctr=1, TRSTa=0, PU=0, PD=1, Output=0.

The reset circuit 60 pulls down a potential of the pull-up node PU to a potential of the first voltage terminal VGL under the control of the reset signal terminal Reset. The pull-down control circuit 30 outputs a high level of the first control terminal Ctr to the pull-down node PD under the control of the first control terminal Ctr. The first pull-down sub-circuit 41 pulls down potentials of the pull-up node PU and the signal output terminal Output to a potential of the first voltage terminal VGL under the control of the pull-down node PD.

Referring to the circuit diagram of the shift register shown in FIG. 7, since a low level is input via the signal input terminal Input, the first transistor M1 is cut off. Since a high level is input via the reset signal terminal Reset, the eleventh transistor M11 is turned on under the control of the high level of the reset signal terminal Reset. The potential of the pull-up node PU is pulled down to the low level of the first voltage terminal VGL through the eleventh transistor M11. In the case where the potential of the pull-up node PU is pulled down to a low level, the second transistor M2, the fifth transistor M5 and the sixth transistor M6 are cut off. Under the control of the high level of the first control terminal Ctr, the third transistor M3 is turned on; and the high level of the first control terminal Ctr is output to the gate electrode of the fourth transistor M4 through the third transistor M3, so as to turn on the fourth transistor M4. The high level of the first control terminal Ctr is output to the pull-down node PD through the fourth transistor M4. Under the control of the high level of the pull-down node PD, the seventh transistor M7 and the eighth transistor M8 are turned on. The potential of the pull-up node PU is maintained at the low level of the first voltage terminal VGL through the seventh transistor M7, and the potential of the signal output terminal Output is maintained at the low level of the first voltage terminal VGL through the eighth transistor M8, thereby achieving denoising of the pull-up node PU and the signal output terminal Output.

In the denoising phase P4: During a portion of the denoising phase P4, the pull-down control circuit 30 and the first pull-down sub-circuit 41 maintain a state in the reset phase P3. During a remaining portion of the denoising phase P4, the second pull-down sub-circuit 42 maintains potentials of the pull-up node PU and the signal output terminal Output at a potential of the first voltage terminal VGL under the control of a signal from the second control terminal TRSTa.

In some embodiments, an image frame includes two time periods. In one of the time periods, a signal is input to the first control terminal Ctr in the denoising phase, so that the pull-down control circuit 30 and the first pull-down sub-circuit 41 maintain potentials of the pull-up node PU and the signal output terminal Output at a potential of the first voltage terminal VGL under the control of a signal of the first control terminal Ctr.

In another one of the time periods, a signal is input to the second control terminal TRSTa in the denoising phase, so that second pull-down sub-circuit 42 maintains potentials of the pull-up node PU and the signal output terminal Output at a potential of the first voltage terminal VGL under the control of the second control terminal TRSTa.

In some embodiments, the plurality of shift registers constituting the gate driving circuit are divided into two groups, that is, a first shift register group and a second shift register group. The first shift register group includes a plurality of shift registers connected in cascade in sequence, and the second shift register group includes a plurality of shift registers connected in cascade in sequence. The first shift register group is used to drive gate lines in an upper portion of a panel, and the second shift register group is used to drive gate lines in a lower portion of the panel.

Based on this, for the first shift register group, the denoising phase P4 includes a portion of a period of scanning a 1st half frame of an image frame P4(1) and an entire period of scanning a 2nd half frame of the image frame P4(2). For the second shift register group, the denoising phase P4 includes an entire period of scanning the 1st half frame of the image frame P4 (2) and a portion of a period of scanning the 2nd half frame of the image frame P4(1).

In the P4(1) period, Input=0, Ctr=1, TRSTa=0, PU=0, PD=1, and Output=0. The pull-down control circuit 30 and the first pull-down sub-circuit 41 maintain a state in the reset phase P3.

Referring to the circuit diagram of the shift register shown in FIG. 7, during the P4 (1) period, as shown in FIGS. 9a and 9b, the third transistor M3, the fourth transistor M4, the seventh transistor M7, and the eighth transistor M8 maintain a state in the reset phase P3, so that potentials of the pull-up node PU and the signal output terminal Output maintain at a low level of the first voltage terminal VGL, thereby achieving denoising of the pull-up node PU and the signal output terminal Output. At this time, since the potential of the second control terminal TRSTa is at a low level, the ninth transistor M9 and the tenth transistor M10 are cut off under the control of the second control terminal TRSTa.

In the P4(2) period, Input=0, Ctr=0, TRSTa=1, PU=0, PD=0, and Output=0. Since the signal output from the first control terminal Ctr is at a low level, the third transistor M3 is cut off. Moreover, since the potential of the pull-up node PU is at a low level, the fifth transistor M5 and the sixth transistor M6 are cut off. Therefore, the potential of the pull-down node PD is in a floating state, and accordingly, gate electrodes of the seventh transistor M7 and the eighth transistor M8 are also in a floating state, and the seventh transistor M7 and the eighth transistor M8 are cut off. Since a high level is output from the second control terminal TRSTa, the ninth transistor M9 and the tenth transistor M10 are turned on under the control of the high level of the second control terminal TRSTa. The potential of the pull-up node PU is maintained at the low level of the first voltage terminal VGL through the ninth transistor M9, and the potential of the signal output terminal Output is maintained at the low level of the first voltage terminal VGL through the tenth transistor M10, thereby achieving denoising of the pull-up node PU and the signal output terminal Output.

Based on this, in the method of driving the shift register provided by some embodiments of the present disclosure, in the case where a plurality of shift registers are cascaded to form a gate driving circuit, the method includes the following steps. In an image frame, during the input phase of the shift register, the pull-up control circuit 10 pulls up the potential of the pull-up node PU to the potential of a signal from the signal input terminal Input under the control of the signal from the signal input terminal Input. Moreover, in the input phase, the pull-down control circuit 30 pulls down the potential of the pull-down node PD to the potential of the first voltage terminal VGL under the control of the pull-up node PU and the first control terminal Ctr. In the output phase of the shift register, the pull-up circuit 20 outputs a signal of the clock signal terminal CLK as a gate line scanning signal to the gate line connected to the signal output terminal Output under the control of the pull-up node PU. In the reset phase of the shift register, the reset circuit 60 pulls down the potential of the pull-up node PU to the potential of the first voltage terminal VGL under the control of a signal from the reset signal terminal Reset. The pull-down control circuit 30 outputs a signal from the first control terminal Ctr to the pull-down node PD under the control of the signal from the first control terminal Ctr, so that the first pull-down sub-circuit 41 pulls down the potentials of the pull-up node PU and the signal output terminal Output to the potential of the first voltage terminal VGL under the control of the pull-down node PD.

In the case where the plurality of shift registers are divided into two groups, for the first shift register group, in the denoising phase of scanning the 1st half frame of the image frame, the pull-down control circuit 30 and the first pull-down sub-circuit 41 are maintained in a state in the reset phase P3, so that potentials of the pull-up node PU and the signal output terminal Output are maintained at a potential of the first voltage terminal VGL under the control of the pull-down node PD. For the first shift register group, when scanning the 2nd half frame of the image frame, the second pull-down sub-circuit 42 maintains the potentials of the pull-up node PU and the signal output terminal Output at the potential of the first voltage terminal VGL under the control of a signal from the second control terminal TRSTa, so as to achieve denoising of the pull-up node PU and the signal output terminal Output.

For the second shift register group, when scanning the 1st half frame of the image frame, the second pull-down sub-circuit 42 maintains the potentials of the pull-up node PU and the signal output terminal Output at the potential of the first voltage terminal VGL under the control of a signal from the second control terminal TRSTa. For the second shift register group, in the denoising phase of scanning the 2nd half frame of the image frame, the pull-down control circuit 30 is made to output a signal of the first control terminal Ctr to the pull-down node PD under the control of the signal of the first control terminal Ctr, so that the first pull-down sub-circuit 41 maintains the potentials of the pull-up node PU and the signal output terminal Output at the potential of the first voltage terminal VGL under the control of the pull-down node PD, so as to achieve denoising of the pull-up node PU and the signal output terminal Output.

As can be seen from the above description, the first control terminal Ctr and the second control terminal TRSTa serve as denoising control signal terminals of the pull-down node PU and the signal output terminal Output. In an image frame, since effective signals of the first control terminal Ctr and the second control terminal TRSTa of the shift register only need to be maintained for half a frame's time, the transistors for realizing the denoising function only need to work for half a frame's time, and the percentage of time a gate bias is applied is approximately 50%. Compared with the situation that the percentage of time the gate bias is applied in the existing DC denoising scheme is close to 100%, in this situation, the threshold voltage shift of each transistor may be greatly reduced. Therefore, the probability of shift register failure due to threshold voltage shift is reduced, and thereby the service life and stability of the shift register and the gate driving circuit are improved. Moreover, since the effective signals of the first control terminal Ctr and the second control terminal TRSTa are both maintained for half a frame's time, the problem of the CLK denoising scheme that the high frequency in which the clock signal is switched between high and low levels may lead to high power consumption of the shift register may be avoided. Therefore, the power consumption of the shift register and the gate driving circuit may be substantially reduced.

Some embodiments of the present disclosure provide a gate driving circuit which, as shown in FIGS. 8 and 12, includes a plurality of shift registers connected in cascade.

In some embodiments, a signal input terminal Input of a first-stage shift register is connected to a start signal terminal STV. Except for the first-stage shift register R1, a signal input terminal Input of each of remaining stages of shift registers is connected to a signal output terminal Output of a shift register in its previous stage.

Except for a last-stage shift register, a reset signal terminal Reset of each of remaining shift registers is connected to a signal output terminal Output of a shift register in its next stage. The reset signal terminal Reset of the last-stage shift register is connected to the start signal terminal STV.

On this basis, adjacent stages of shift registers constitute a shift register group, and the gate driving circuit includes M+1 shift register groups. M is an integer and M≥1.

The gate driving circuit is connected to M+1 first control signal input terminals. First control terminals Ctr of shift registers in different shift register groups are connected to different first control signal input terminals, and first control terminals Ctr of shift registers in the same shift register group are connected to the same first control signal input terminal.

The gate driving circuit is connected to M+1 second control signal input terminals, and each stage of shift register is connected to M second control signal input terminals. Each stage of shift register in the same shift register group is connected to the same second control signal input terminals, and a second control signal input terminal that is not connected in different shift register groups is different. M is the number of second pull-down sub-circuits in the shift register.

It will be noted that, since the M second control terminals of each stage of shift register are respectively connected to M second control signal input terminals, each stage of shift register must have a second control signal terminal that is not connected. In some embodiments of the present disclosure, a second control signal input terminal that is not connected to the shift registers in different shift register groups is different.

The connection relationship of each stage of shift registers in the gate driving circuit will be described in detail below by taking M=1 and M=2 as examples.

When M=1, that is, the shift register includes a single second pull-down sub-circuit, in some embodiments, the gate driving circuit formed by cascading shift registers is as shown in FIG. 8. The gate driving circuit includes a first shift register group (1st half GOA) and a second shift register group (2nd half GOA). The 1st half GOA is composed of adjacent stages of shift registers in the upper half of the gate driving circuit, and the 2nd half GOA is composed of adjacent stages of shift registers in the lower half of the gate driving circuit.

On this basis, as shown in FIG. 8, the gate driving circuit is connected to the first control signal input terminal Ctr1 and the first control signal input terminal Ctr2. The first control terminals Ctr of the shift registers in the 1st half GOA are all connected to the first control signal input terminal Ctr1. The first control terminals Ctr of the shift registers in the 2nd half GOA are all connected to the first control signal input terminal Ctr2. The first control terminals Ctr of shift registers in the 1st half GOA are all connected to the same first control signal input terminal. The first control terminals Ctr of shift registers in the 2nd half GOA are all connected to the same first control signal input terminal.

The gate driving circuit is connected to the second control signal input terminal T1 and the second control signal input terminal T2. The second control terminals TRSTa of shift registers in the 1st half GOA are all connected to the second control signal input terminal T1. The second control terminals TRSTa of shift registers in the 2nd half GOA are all connected to the second control signal input terminal T2.

On this basis, since the first control terminals Ctr and the second control terminals TRSTa serve as denoising control signal terminals, in an image frame, the signals of the first control terminals Ctr and the second control terminals TRSTa only need to maintain an active level for half a frame's time. Therefore, all the transistors for realizing the denoising function only need to work for half a frame's time, and percentage of time the gate bias is applied is approximately 50%. Compared with the percentage of time the gate bias is applied in the DC denoising scheme, which is close to 100%, in this situation, the threshold voltage shift of each transistor may be greatly reduced. Therefore, the probability of shift register failure due to threshold voltage shift is reduced, and thereby the service life and stability of the shift register and the gate driving circuit are improved. Moreover, since the effective signals of the first control terminals Ctr and the second control terminals TRSTa are both maintained for half a frame's time, the problem of the CLK denoising scheme that the high frequency at which the clock signal is switched between high and low levels may lead to high power consumption of the shift register may be avoided. Therefore, the power consumption of the shift register and the gate driving circuit may be greatly reduced.

When M=2, that is, the shift register includes two second pull-down sub-circuits, in some embodiments, the gate driving circuit formed by cascading shift registers is as shown in FIG. 12. The gate driving circuit includes three shift register groups, in which the first shift register group (1st ⅓ GOA) is composed of adjacent ⅓ stages of cascaded shift registers in the front, the second shift register group (2nd ⅓ GOA) is composed of adjacent ⅓ stages of shift registers in the middle, and the third shift register group (3rd ⅓ GOA) is composed of adjacent ⅓ stages of shift registers in the back.

On this basis, as shown in FIG. 12, the gate driving circuit is connected to the first control signal input terminal Ctr1, the first control signal input terminal Ctr2, and the first control signal input terminal Ctr3. The first control terminals Ctr of the shift registers in the 1st ⅓ GOA are all connected to the first control signal input terminal Ctr1. The first control terminals Ctr of the shift registers in the 2nd ⅓ GOA are all connected to the first control signal input terminal Ctr2. The first control terminals Ctr of the shift registers in the 3rd ⅓ GOA are all connected to the first control signal input terminal Ctr3. The first control terminals Ctr of shift registers in each of the shift register groups are connected to the same first control signal input terminal.

The gate driving circuit is connected to the second control signal input terminal T1, the second control signal input terminal T2, and the second control signal input terminal T3. The second control terminals TRSTa and the second control terminals TRSTb of shift registers are connected to a second control signal input terminals, and each stage of shift registers in the same shift register group is connected to the same two second control signal input terminals. For different shift register groups, a second control signal input terminal that is not connected is different.

In some embodiments, as shown in FIG. 12, each stage of shift registers in the 1st ⅓ GOA is connected to the second control signal input terminal T2 and the second control signal input terminal T3. Each stage of shift registers in the 2nd ⅓ GOA is connected to the second control signal input terminal T1 and the second control signal input terminal T3. Each stage of shift registers in the 3rd ⅓ GOA is connected to the second control signal input terminal T1 and the second control signal input terminal T2.

It will be noted that, in the same shift register group, it will not be limited in the embodiments of the present disclosure that the same second control terminals of the shift registers are connected to the same second control signal input terminal. For example, in the 1st ⅓ GOA, the second control terminal TRSTa of the first-stage shift register R1 is connected to the second control signal input terminal T2, and the second control terminal TRSTb is connected to the second control signal input terminal T3. The second control terminal TRSTa of the second-stage shift register R2 is connected to the second control signal input terminal T2, and the second control terminal TRSTb is connected to the second control signal input terminal T3. The second control terminals of each stage of shift registers in the 2nd ⅓ GOA and the 3rd ⅓ GOA are connected to the second control signal input terminals in a similar way, which will not be repeated herein.

On this basis, in the gate driving circuit shown in FIG. 12, the first control terminals Ctr, the second control terminals TRSTa, and the second control terminals TRSTb serve as denoising control signal terminals. In an image frame, since high level signals of the first control terminals Ctr, the second control terminals TRSTa, and the second control terminals TRSTb of the shift registers only need to be maintained for one third of a frame's time, the transistors for realizing the denoising function only need to work for one third of a frame's time, and the percentage of time a gate bias is applied is approximately 33%. Compared with the 50% percentage of time the gate bias is applied in each transistor, the threshold voltage shift of each transistor is further reduced. Therefore, the service life and stability of the shift register and the gate driving circuit are further improved.

On this basis, when the shift register includes more second pull-down sub-circuits, a principle of a connection relationship between the second control terminals of each stage of shift registers and the second control signal input terminals is the same, which will not be repeated here.

Some embodiments of the present disclosure provide a display device including the gate driving circuit described above. The display device has the same structure and advantageous effects as the gate driving circuit. Since the structure and beneficial effects of the gate driving circuit have been described in detail in the foregoing embodiments, they will not be repeated herein.

It will be noted that, in some embodiments of the present disclosure, the display device includes at least a liquid crystal display device and an organic light emitting diode display device. For example, the display device is any product or component having a display function such as a liquid crystal display, a liquid crystal television, a digital photo frame, a mobile phone, or a tablet computer.

The foregoing descriptions are merely some implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A gate driving circuit, comprising a plurality of shift registers connected in cascade, wherein each of the plurality of shift registers comprises
    a pull-up control circuit connected to a signal input terminal and a pull-up node, wherein the pull-up control circuit is configured to pull up a potential of the pull-up node to a potential of a signal from the signal input terminal under a control of the signal from the signal input terminal;
    a pull-up circuit connected to the pull-up node, a clock signal terminal and a signal output terminal, wherein the pull-up circuit is configured to output a signal from the clock signal terminal to the signal output terminal under a control of the pull-up node;
    a pull-down control circuit connected to a first control terminal, a pull-down node, a first voltage terminal, and the pull-up node, wherein the pull-down control circuit is configured to pull down a potential of the pull-down node to a potential of the first voltage terminal under the control of the pull-up node, and to output a signal from the first control terminal to the pull-down node under a control of the signal from the first control terminal;
    a pull-down circuit connected to the pull-down node, the pull-up node, a second control terminal, the first voltage terminal, and the signal output terminal, wherein the pull-down circuit is configured to pull down potentials of the pull-up node and the signal output terminal to a potential of the first voltage terminal under a control of the pull-down node, and to pull down potentials of the pull-up node and the signal output terminal to a potential of the first voltage terminal under a control of a signal from the second control terminal; and
    a reset circuit connected to a reset signal terminal, the first voltage terminal, and the pull-up node, wherein the reset circuit is configured to pull down a potential of the pull-up node to a potential of the first voltage terminal under a control of a signal from the reset signal terminal; wherein,
    a signal input terminal of a first-stage shift register is connected to a start signal terminal; except for the first-stage shift register, a signal input terminal of each of remaining stages of shift registers is connected to a signal output terminal of a shift register in a previous stage;
    except for a last-stage shift register, a reset signal terminal of each of remaining stages of shift registers is connected to a signal output terminal of a shift register in a next stage; a reset signal terminal of the last-stage shift register is connected to the start signal terminal;
    adjacent stages of shift registers constitute a shift register group, and the gate driving circuit comprises M+1 shift register groups;
    the gate driving circuit is connected to M+1 first control signal input terminals, wherein first control terminals of shift registers in different shift register groups are connected to different first control signal input terminals, and first control terminals of shift registers in the same shift register group are connected to a same first control signal input terminal;
    the gate driving circuit is connected to M+1 second control signal input terminals, wherein each stage of shift registers is connected to M second control signal input terminals; each stage of shift registers in a same shift register group is connected to same M second control signal input terminals, and a second control signal input terminal that is not connected in different shift register groups is different;
    a switching frequency of a high level and a low level of the first control terminal and the second control terminal in one frame of image is less than the switching frequency of the high level and the low level of the clock signal terminal in one frame of image;
    the first control terminal and the second control terminal are non-clock signal terminals outside the gate driving circuit; and
    M is an integer and M≥1.

2. A display device, comprising the gate driving circuit according to claim 1.

3. The gate driving circuit according to claim 1, wherein the pull-down circuit comprises a first pull-down sub-circuit and at least one second pull-down sub-circuit;
    the first pull-down sub-circuit is connected to the pull-down node, the pull-up node, the first voltage terminal, and the signal output terminal; and
    the at least one second pull-down sub-circuit is connected to the second control terminal, the pull-up node, the signal output terminal, and the first voltage terminal.

4. The gate driving circuit according to claim 3, wherein the pull-up control circuit comprises a first transistor;
    a gate electrode and a first electrode of the first transistor are connected to the signal input terminal, and a second electrode of the first transistor is connected to the pull-up node.

5. The gate driving circuit according to claim 3, wherein the pull-up circuit comprises a second transistor and a first capacitor;
    a gate electrode of the second transistor is connected to the pull-up node, a first electrode of the second transistor is connected to the clock signal terminal, and a second electrode of the second transistor is connected to the signal output terminal;
    one end of the first capacitor is connected to the pull-up node, and another end of the first capacitor is connected to the signal output terminal.

6. The gate driving circuit according to claim 3, wherein the pull-down control circuit comprises a third transistor, a fourth transistor, a fifth transistor and a sixth transistor;

a gate electrode and a first electrode of the third transistor is connected to the first control terminal, a second electrode of the third transistor is connected to a gate electrode of the fourth transistor and a first electrode of the fifth transistor;

a first electrode of the fourth transistor is connected to the first control terminal, and a second electrode of the fourth transistor is connected to the pull-down node;

a gate electrode of the fifth transistor is connected to the pull-up node, and a second electrode of the fifth transistor is connected to the first voltage terminal;

a gate electrode of the sixth transistor is connected to the pull-up node, a first electrode of the sixth transistor is connected to the pull-down node, and a second electrode of the sixth transistor is connected to the first voltage terminal.

7. The gate driving circuit according to claim 3, wherein the first pull-down sub-circuit comprises a seventh transistor and an eighth transistor;

a gate electrode of the seventh transistor is connected to the pull-down node, a first electrode of the seventh transistor is connected to the pull-up node, and a second electrode of the seventh transistor is connected to the first voltage terminal;

a gate electrode of the eighth transistor is connected to the pull-down node, a first electrode of the eighth transistor is connected to the signal output terminal, and a second electrode of the eighth transistor is connected to the first voltage terminal.

8. The gate driving circuit according to claim 3, wherein each of the at least one second pull-down sub-circuit comprises a ninth transistor and a tenth transistor;

a gate electrode of the ninth transistor is connected to the second control terminal, a first electrode of the ninth transistor is connected to the pull-up node, and a second electrode of the ninth transistor is connected to the first voltage terminal;

a gate electrode of the tenth transistor is connected to the second control terminal, a first electrode of the tenth transistor is connected to the signal output terminal, and a second electrode of the tenth transistor is connected to the first voltage terminal.

9. The gate driving circuit according to claim 3, wherein the reset circuit comprises an eleventh transistor;

a gate electrode of the eleventh transistor is connected to the reset signal terminal, a first electrode of the eleventh transistor is connected to the pull-up node, and a second electrode of the eleventh transistor is connected to the first voltage terminal.

10. A method of driving the gate driving circuit according to claim 1, in an image frame, the method comprising:

in an input phase, pulling up, by the pull-up control circuit, a potential of the pull-up node to a potential of a signal from the signal input terminal under the control of the signal from the signal input terminal, and pulling down, by the pull-down control circuit, a potential of the pull-down node to a potential of the first voltage terminal under the control of the pull-up node and a signal from the first control terminal;

in an output phase, outputting, by the pull-up circuit, a signal of the clock signal terminal to the signal output terminal under the control of the pull-up node;

in a reset phase, pulling down, by the reset circuit, a potential of the pull-up node to a potential of the first voltage terminal under the control of a signal from the reset signal terminal; outputting, by the pull-down control circuit, a signal from the first control terminal to the pull-down node under the control of the signal from the first control terminal; and pulling down, by the pull-down circuit, potentials of the pull-up node and the signal output terminal to a potential of the first voltage terminal under the control of the pull-down node;

in a denoising phase, during a portion of the denoising phase, maintaining, by the pull-down control circuit and the pull-down circuit, potentials of the pull-up node and the signal output terminal at a potential of the first voltage terminal under the control of a signal from the first control terminal; during a remaining portion of the denoising phase, maintaining, by the pull-down circuit, potentials of the pull-up node and the signal output terminal at a potential of the first voltage terminal under the control of a signal from the second control terminal, wherein the switching frequency of the high level and the low level of the first control terminal and the second control terminal in one frame of image is less than the switching frequency of the high level and the low level of the clock signal terminal in one frame of image;

the first control terminal and the second control terminal are non-clock signal terminals outside the gate driving circuit.

11. The method of driving the gate driving circuit according to claim 10, wherein the pull-down circuit comprises a first pull-down sub-circuit and a second pull-down sub-circuit;

an image frame includes two time periods;

in one of the time periods, a signal is input to the first control terminal in the denoising phase, so that the pull-down control circuit and the first pull-down sub-circuit maintain potentials of the pull-up node and the signal output terminal at a potential of the first voltage terminal under the control of the signal input to the first control terminal;

in another time period, a signal is input to the second control terminal in the denoising phase, so that the second pull-down sub-circuit maintain potentials of the pull-up node and the signal output terminal at a potential of the first voltage terminal under the control of the second control terminal.

* * * * *